(12) United States Patent
Wu

(10) Patent No.: US 6,690,058 B2
(45) Date of Patent: Feb. 10, 2004

(54) SELF-ALIGNED MULTI-BIT FLASH MEMORY CELL AND ITS CONTACTLESS FLASH MEMORY ARRAY

(76) Inventor: Ching-Yuan Wu, 1F, No. 23, R&D Rd.1, Science-Based Industrial Park, Hsinchu (TW)

( * ) Notice: Subject to any disclaimer, the term of this patent is extended or adjusted under 35 U.S.C. 154(b) by 0 days.

(21) Appl. No.: 10/118,889

(22) Filed: Apr. 10, 2002

(65) Prior Publication Data

US 2003/0193064 A1 Oct. 16, 2003

(51) Int. Cl.[7] .............................................. H01L 29/788
(52) U.S. Cl. .......................... 257/316; 257/390; 257/401
(58) Field of Search ................................. 257/314–326, 257/390, 401, 382–385; 438/257–267

(56) References Cited

U.S. PATENT DOCUMENTS

| | | | |
|---|---|---|---|
| 5,364,806 A | 11/1994 | Ma et al. | |
| 5,654,917 A | 8/1997 | Ogura et al. | |
| 5,834,808 A | * 11/1998 | Tsukiji | ........................ 257/315 |
| 6,051,860 A | 4/2000 | Odanaka et al. | |
| 6,133,098 A | 10/2000 | Ogura et al. | |
| 6,248,633 B1 | 6/2001 | Ogura et al. | |
| 6,291,855 B1 | 9/2001 | Chang et al. | |
| 6,313,501 B1 | 11/2001 | Kwon | |
| 6,323,088 B1 | * 11/2001 | Gonzalez et al. | ........... 438/257 |
| 6,462,375 B1 | * 10/2002 | Wu | ............................. 257/316 |

* cited by examiner

Primary Examiner—Wael Fahmy, Jr.
Assistant Examiner—Marcos D. Pizarro-Crespo
(74) Attorney, Agent, or Firm—Pro-Techtor International Services

(57) ABSTRACT

A self-aligned multi-bit flash memory cell of the present invention comprises two floating-gate structures with a spacing dielectric layer being formed therebetween; a planarized control-gate layer over an intergate-dielectric layer being formed over the two floating-gate structures and the spacing dielectric layer; and a common-source/drain conductive bit line together with a first sidewall dielectric spacer being formed over a flat bed formed by a common-source/drain diffusion region and nearby etched raised field-oxide layers. A contactless multi-bit flash memory array of the present invention comprises a plurality of common-source/drain conductive bit lines being formed transversely to a plurality of parallel STI regions and a plurality of word lines integrated with a plurality of planarized control-gate layers of the described cells being patterned and formed transversely to the plurality of common-source/drain conductive bit lines.

20 Claims, 14 Drawing Sheets

SELF-ALIGNED MULTI-BIT FLASH MEMORY CELL AND ITS CONTACTLESS FLASH MEMORY ARRAY

FIELD OF THE INVENTION

The present invention relates in general to a flash memory cell and its memory array and, more particularly, to a self-aligned multi-bit flash memory cell and its contactless flash memory array.

DESCRIPTION OF THE RELATED ART

A flash memory cell structure can be basically divided into two categories: a stack-gate structure and a split-gate structure, in which the stage-gate structure having the gate length of a cell defined by a minimum-feature size (F) of technology used is often used in existing high-density flash memory system. The stack-gate flash memory cells can be interconnected to form different circuit configurations based on the basic logic function, such as NOR, NAND and AND. A stack-gate flash memory cell can be programmed by channel hot-electron injection to have different threshold-voltage levels for a multi-bit storage. However, the endurance of the cell and the sensing of the threshold-voltage levels become a difficult task, especially the gate length of a stack-gate flash memory cell is scaled. Therefore, a dual-bit flash memory cell with two floating-gate structures becomes a major trend of developments.

FIG. 1A shows a cross-sectional view of a dual-bit flash memory cell, in which two stackgate transistors 22G, 20G spaced by a select-gate transistor 24G are formed on a semiconductor substrate 26; two common $N^+/N^-$ diffusion regions 22A, 20A are separately formed in each side of the gate region; a select-gate line (SG) is formed above two common $N^+/N^-$ diffusion regions and two stack-gate transistors and on a gate dielectric layer 24A being formed on a semiconductor substrate 26. Since the stackgate transistor, the select-gate transistor and the common $N^+/N^-$ diffusion region can be defined by a masking photoresist step with a minimum-feature F, the cell size of each bit in a dual-bit flash memory cell can be designed to be equal to $4F^2$ if the select-gate line and its space can be defined to be a minimum-feature-size F. FIG. 1B shows a top plan view of a dual-bit flash memory cell shown in FIG. 1A. Apparently, the cell size of each bit shown in FIG. 1A and FIG. 1B can be made to be comparable to that of a NAND-type flash memory array due to the contactless structure. However, there are several drawbacks that can be easily observed from FIG. 1A and FIG. 1B: very high parasitic capacitance between the select-gate line (SG) and the common $N^+/N^-$ diffusion regions 22A, 20A; very high parasitic capacitance between the select-gate line (SG) and the control-gate lines 22C, 20C; isolation between the common $N^+/N^-$ diffusion regions is poor for the regions outside of the select-gate region 24A; and isolation between nearby select-gate lines is very poor for the regions under the control-gate lines 22C, 20C. It should be emphasized that poor isolation between nearby select-gate lines may result in an erroneous data reading from nearby cells under the same control-gate line.

It is therefore an objective of the present invention to provide a self-aligned multi-bit flash memory cell having a cell size of each bit being smaller than $2F^2$.

It is another objective of the present invention to provide a self-aligned multi-bit flash memory cell being programmed by a mid-channel hot-electron injection with much better programming efficiency and much smaller programming power.

It is a further objective of the present invention to provide a highly conductive common-source/drain bus line for each of bit-lines in a contactless multi-bit flash memory array with much smaller bit-line resistance and much smaller bit-line parasitic capacitance with respect to the semiconductor substrate and the word lines.

It is yet another objective of the present invention to provide a highly conductive metal line for each of word lines in a contactless multi-bit flash memory array with much smaller word-line resistance and much smaller word-line parasitic capacitance with respect to the bit-lines.

Other objectives and advantages of the present invention will be more apparent from the following description.

SUMMARY OF THE INVENTION

A self-aligned multi-bit flash memory cell and its contactless multi-bit flash memory array are disclosed by the present invention. The self-aligned multi-bit flash memory cell is formed on a semiconductor substrate of a first conductivity type having an active region isolated by two parallel shallow-trench-isolation (STI) regions and can be divided into three regions: a common-source region, a gate region, and a common-drain region, in which the gate region is located between the common-source region and the common-drain region. The common-source/drain region comprises a first/second sidewall dielectric spacer being formed over each sidewall of the gate region and on a portion of a first/second flat bed being formed by a common-source/drain diffusion region and the etched first/second raised field-oxide layers, a common-source/drain conductive bus line being formed over the first/second flat bed outside of the first/second sidewall dielectric spacer, and a first/second planarized thick-oxide layer being formed over the common-source/drain conductive bus line and the first/second sidewall dielectric spacer. The gate region comprises a first floating-gate structure having a first floating-gate layer (FG1) formed on a first gate-dielectric layer and a second floating-gate structure having a second floating-gate layer (FG2) formed on a second gate-dielectric layer, wherein the first floating-gate structure and the second floating-gate structure being spaced with a spacing dielectric layer are formed in the active region; and a planarized control-gate layer (CG) over an intergate dielectric layer is at least formed over the first/second floating-gate structure, the spacing dielectric layer, the sidewalls of the first/second sidewall dielectric spacers, and the raised field-oxide layers for the first embodiment of the present invention. A first interconnect-metal layer is formed over the intergate-dielectric layers on the common-source/drain regions and the planarized control-gate layer (CG) to act as a word line, wherein the first interconnect-metal layer together with the planarized control-gate layer are simultaneously patterned by a masking dielectric layer and its two sidewall dielectric spacers. An implanted region of a first conductivity type is formed in a semiconductor substrate under the second floating-gate structure, wherein the implanted region comprises a shallow implant region for threshold-voltage adjustment and a deep implant region for forming a punch-through stop. Similarly, if the intergate dielectric layer for the first embodiment of the present invention is replaced by an intergate-dielectric layer being only formed over the first/second floating-gate layers and the spacing dielectric layer in the active region, the self-aligned multi-bit flash memory cell becomes the second embodiment of the present invention.

A contactless multi-bit flash memory array of the present invention is formed on a semiconductor substrate of a first conductivity type having a plurality of parallel STI regions and a plurality of active regions formed alternately. A plurality of common-source bus-line regions and a plurality of virtual-gate regions are formed alternately and transversely to the plurality of parallel STI regions, wherein each of the plurality of virtual-gate regions comprises a pair of gate regions being located in each side portion and a common-drain bus-line region being located between the pair of gate regions. Each of the plurality of common-source bus-line regions comprises a pair of first sidewall dielectric spacers being formed over each sidewall of nearby virtual-gate regions and on a portion of a first flat bed being alternately formed by a common-source diffusion region of a second conductivity type and an etched first raised field-oxide layer; a common-source conductive bus line being formed over the first flat bed between the pair of first sidewall dielectric spacers; and a first planarized thick-oxide layer being formed over the common-source conductive bus line and the pair of first sidewall dielectric spacers. Each of the common-drain bus-line regions comprises a pair of second sidewall dielectric spacers being formed over each sidewall of nearby gate regions and on a portion of a second flat bed being alternately formed by a common-drain diffusion region and an etched second raised field-oxide layer; a common-drain conductive bus line being formed over the second flat bed between the pair of second sidewall dielectric spacers; and a second planarized thick-oxide layer being formed over the common-drain conductive bus line and the pair of second sidewall dielectric spacers. Each of the pair of gate regions comprises a plurality of first floating-gate layers being formed over a plurality of first gate-dielectric layers in a side portion of the plurality of active regions and a plurality of second floating-gate layers being formed over a plurality of second gate-dielectric layers in another side portion of the plurality of active regions with a spacing dielectric layer being formed between each of the first floating-gate layer over the first gate-dielectric layer and each of the second floating-gate layer over the second gate-dielectric layer; a plurality of planarized control-gate layers together with a plurality of first interconnect-metal layers being simultaneously patterned and etched to form a plurality of word lines transversely to the plurality of common-source/drain conductive bus lines. An intergate dielectric layer is at least formed over the first/second floating-gate layers, the spacing dielectric layers, the first/second planarized thick-oxide layers, the first/second sidewall dielectric spacers, and the raised field-oxide layers in each of the gate regions for the first embodiment of the present invention, wherein each of the plurality of word lines is formed over the intergate dielectric layer on the plurality of common-source/drain bus-line regions. However, the intergate-dielectric layer is only formed over the first/second floating-gate layers and the spacing dielectric layer in each of the active regions for the second embodiment of the present invention.

BRIEF DESCRIPTION OF THE DRAWINGS

FIG. 1 shows the schematic diagrams of the prior art, in which

FIG. 2 shows the schematic diagrams of the present invention, in which FIG. 2A(*a*) shows a cross-sectional view of a self-aligned multi-bit flash memory cell for the first embodiment of the present invention.

DETAILED DESCRIPTION OF THE PREFERRED EMBODIMENTS

Figure 1A:
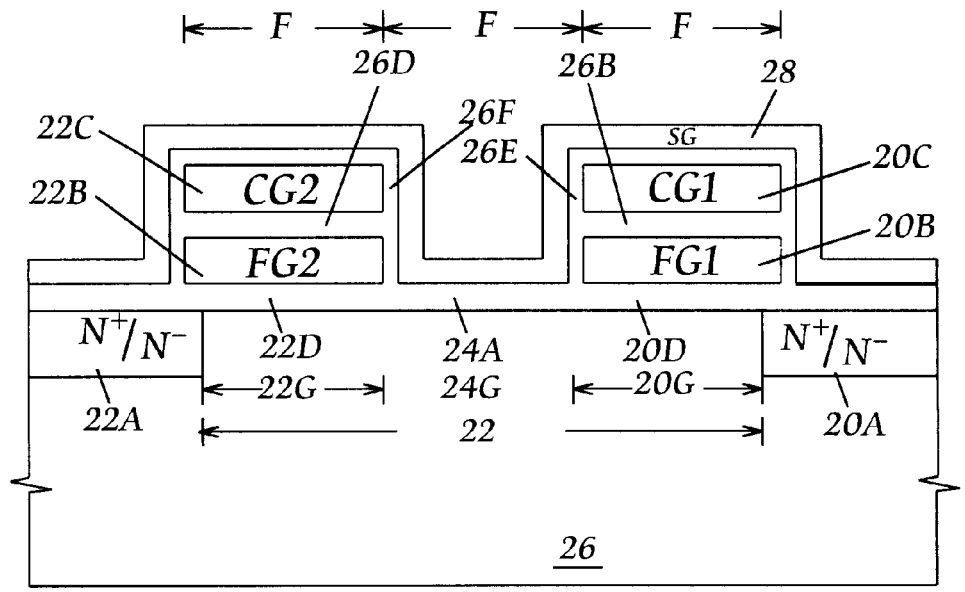
FIG. 1A shows a cross-sectional view of a dual-bit flash memory cell and FIG. 1B shows a top plan view.
Figure 1B:
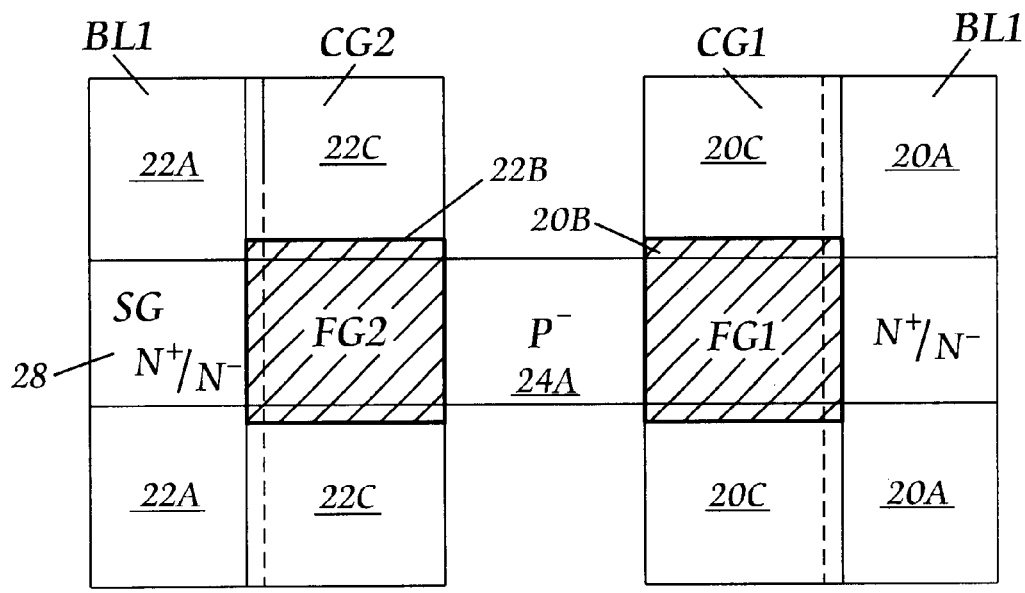
Figure 2A:
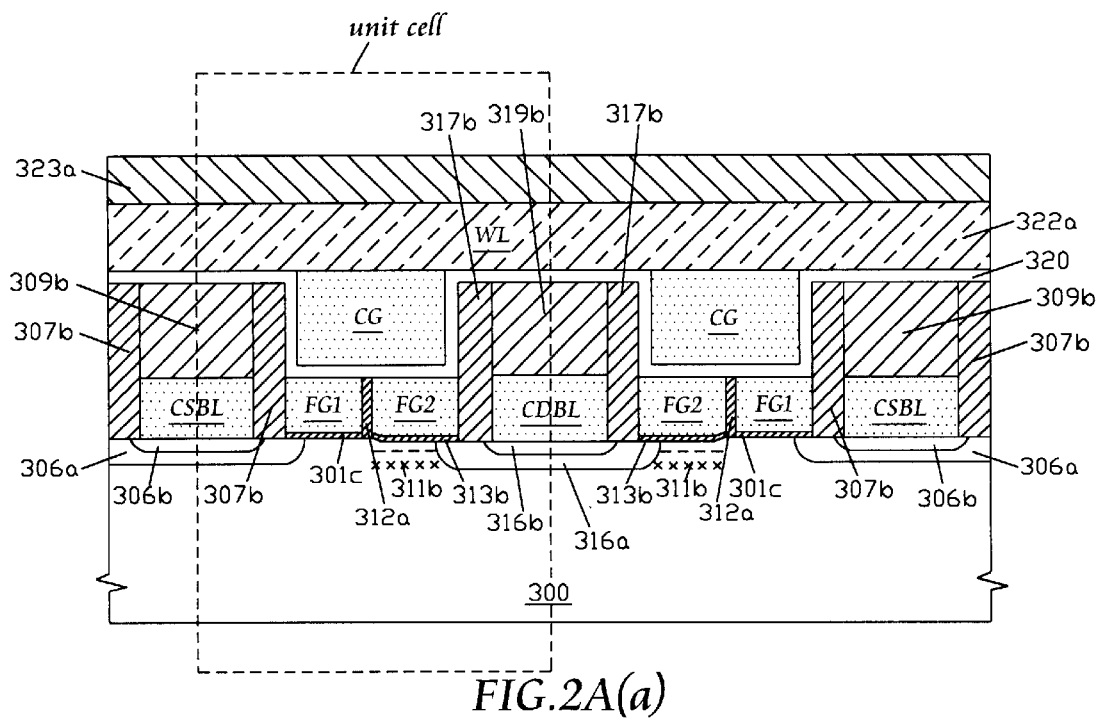
FIG. 2A(*b*) shows a cross-sectional view of a self-aligned multi-bit flash memory cell for the second embodiment of the present invention.
Figure 2A:
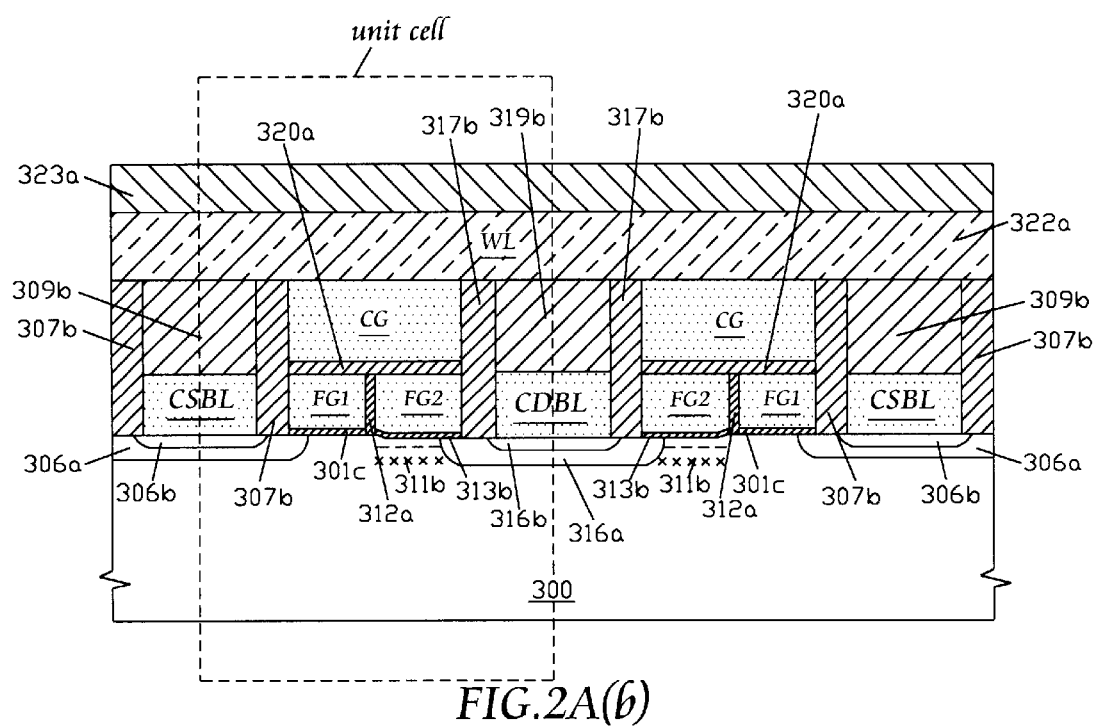

Referring now to FIG. 2A(*a*) and FIG. 2A(*b*), there are shown the cross-sectional views of two self-aligned multi-bit flash memory cells of the present invention. FIG. 2A(*a*) shows a cross-sectional view of a self-aligned multi-bit flash memory cell for the first embodiment of the present invention, and FIG. 2A(*b*) shows a cross-sectional view of a self-aligned multi-bit flash memory cell for the second embodiment of the present invention. From FIG. 2A(*a*), a self-aligned multi-bit flash memory cell as indicated by a dash line can be divided into three regions: a common-source region, a gate region, and a common-drain region, in which the gate region is located between the common-source region and the common-drain region. The common-source/drain region comprises a first/second sidewall dielectric spacer 307*b*/317*b* being formed over each sidewall of the gate region and on a portion of a first/second flat bed being formed by a common-source/drain diffusion region 306*a*/316*a* of a second conductivity type and nearby two etched first/second raised field-oxide layers (see FIG. 5 and FIG. 6); a common-source/drain conductive bus line 308*b*/318*b* (CSBL/CDBL) being formed over the first/second flat bed outside of the first/second sidewall dielectric spacer 307*b*/317*b*; and a first/second planarized thick-oxide layer 309*b*/319*b* being formed over the common-source/drain conductive bus line 308*b*/318*b* (CSBL/CDBL) and the first/second sidewall dielectric spacer 307*b*/317*b*. The gate region comprises a first floating-gate structure having a first floating-gate layer 302*c* (FG1) formed on a first gate-dielectric layer 301*c* and a second floating-gate structure having a second floating-gate 314*c* (FG2) formed on a second gate-dielectric layer 313*b*, wherein the first floating-gate structure and the second floating-gate structure being spaced with a spacing dielectric layer 312*a* are formed in an active region being isolated by two shallow-trench isolation regions being filled with the raised field-oxide layers 304*b*; and a planarized control-gate layer 321*b* (CG) over an intergate dielectric layer 320 is at least formed over the first/second floating-gate structures, the spacing dielectric layer 312*a*, the first/second sidewall dielectric spacers 307*b*/317*b* and the raised field-oxide layers 304*b* for the first embodiment of the present invention. A first interconnect-metal layer 322*a* is formed over the intergate dielectric layer 320 on the common-source/drain regions and the planarized control-gate layer 321b (CG) to act as a word line (WL), wherein the first interconnect-metal layer 322a together with the planarized control-gate layer 321b (CG) are simultaneously patterned by a masking dielectric layer 323a and its two sidewall dielectric spacers 324a (see FIG. 5 and FIG. 6). An implanted region 311b of a first conductivity type is formed in a semiconductor substrate 300 of a first conductivity type under the second floating-gate structure, wherein the implanted region 311b comprises a shallow implant region for threshold-voltage adjustment and a deep implant region for forming a punch-through stop. FIG. 2A(b) shows a similar cell structure as shown in FIG. 2A(a) except that an intergate dielectric layer 320a instead of the intergate dielectric layer 320 is only formed over the first/second floating-gate layers and the spacing dielectric layer 312a.

Figure 2B:
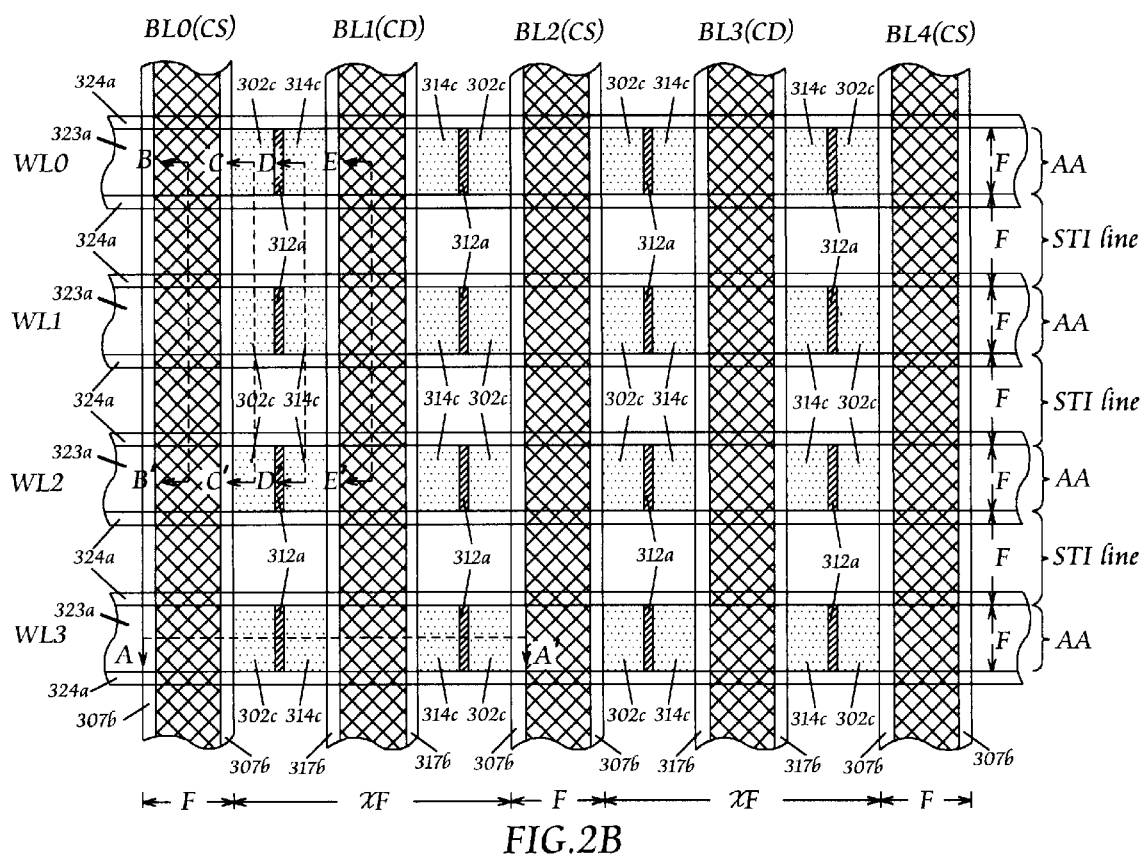
FIG. 2B shows a top plan view of a contactless multi-bit flash memory array of the present invention.

FIG. 2B shows a top plan view of a contactless multi-bit flash memory array of the present invention, in which a plurality of parallel shallow-trench-isolation (STI) regions as indicated by STI lines and a plurality of active regions as indicated by AA's are formed alternately on a semiconductor substrate 300 of a first conductivity type. A plurality of common-source bus-line regions and a plurality of virtual-gate regions are formed alternately and transversely to the plurality of parallel STI regions, wherein each of the plurality of virtual-gate regions comprises a pair of gate regions being located in each side portion and a common-drain busline region being located between the pair of gate regions. Each of the plurality of common-source bus-line regions comprises a pair of first sidewall dielectric spacers 307b being formed over each sidewall of nearby virtual-gate regions and on a portion of a first flat bed being alternately formed by a common-source diffusion region 306a, 306b of a second conductivity type and an etched first raised field-oxide layer 304c; a common-source conductive bus line 308b being formed over the first flat bed between the pair of first sidewall dielectric spacers 307b; and a first planarized thick-oxide layer 309b being formed over the common-source conductive bus line 308b and the pair of first sidewall dielectric spacers 307b. Each of the common-drain bus-line regions comprises a pair of second sidewall dielectric spacers 317b being formed over each sidewall of nearby gate regions and on a portion of a second flat bed being alternately formed by a common-drain diffusion region 316a, 316b and an etched second raised field-oxide layer 304d; a common-drain conductive bus line 318b being formed over the second flat bed between the pair of second sidewall dielectric spacers 317b; and a second planarized thick-oxide layer 319b being formed over the common-drain conductive bus line 318b and the pair of second sidewall dielectric spacers 317b. Each of the pair of gate regions comprises a plurality of first floating-gate layers 302c (FG1) being formed over a plurality of first gate-dielectric layers 301c in a side portion of the plurality of active regions and a plurality of second floating-gate layers 314c (FG2) being formed over a plurality of second gate-dielectric layers 313b in another side portion of the plurality of active regions with a spacing dielectric layer 312a being formed between each of the first floating-gate layer 302c over the first gate-dielectric layer 301c and each of the second floating-gate layer 314c over the second gate-dielectric layer 313b; a plurality of planarized control-gate layers 321b (CG) together with a plurality of first interconnect-metal layers 322a being simultaneously patterned and etched to form a plurality of integrated word lines (WL's) transversely to the plurality of common-source/drain conductive bus lines 308b, 316b. An intergate dielectric layer 320 is at least formed over the first/second floating-gate layers 302c/314c, the spacing dielectric layers 312a, the first/second planarized thick-oxide layers 309b/319b, the first/second sidewall dielectric spacers 307b/317b, and the raised fieldoxide layers 304b in each of the gate regions for the first embodiment of the present invention, wherein each of the plurality of integrated word lines is formed over the intergate dielectric layer 320 on the plurality of common-source/drain bus-line regions. However, the intergate dielectric layers 302a are only formed over the first/second floating-gate layers 302c/314c and the spacing dielectric layers 312a in each of the active regions for the second embodiment of the present invention.

Figure 2C:
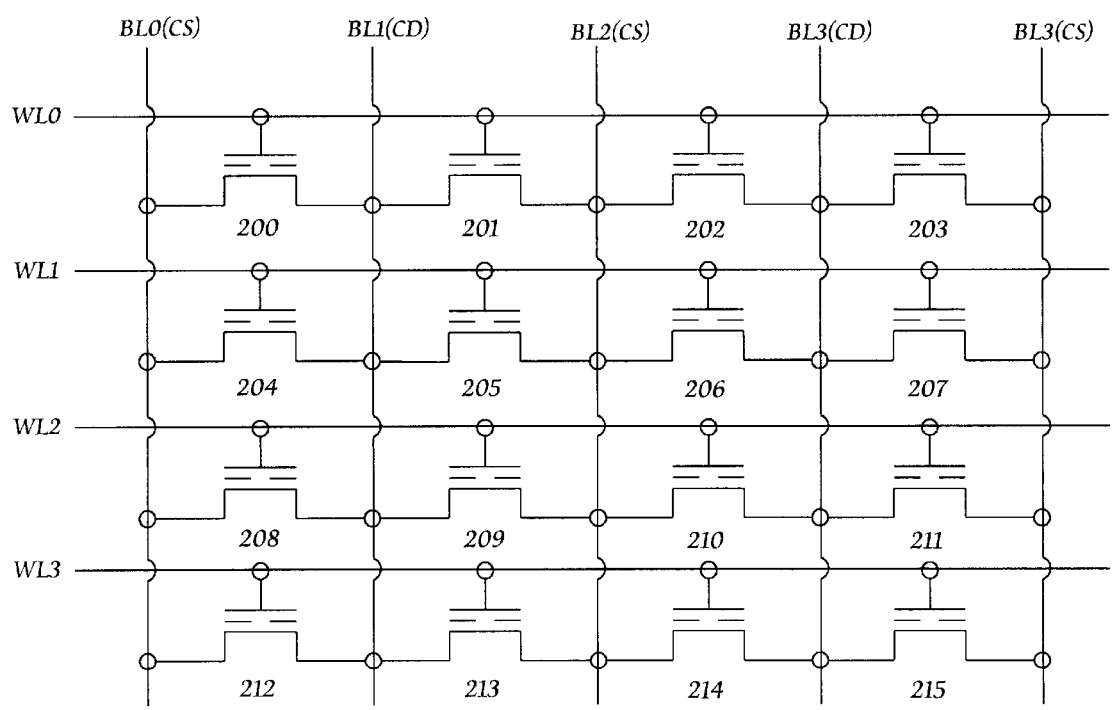
FIG. 2C shows a schematic circuit diagram of a contactless multi-bit flash memory array shown in FIG. 2B.

FIG. 2C shows a schematic circuit diagram of a contactless multi-bit flash memory array shown in FIG. 2B, in which a plurality of common-source conductive bus-lines (BL0, BL2, BL4) are formed alternately in a matrix form; a plurality of paired multi-bit flash memory cells are formed between nearby common-source conductive bus lines with each of common-drain conductive bus lines (BL1, BL3) being connected between the plurality of paired multi-bit flash memory cells in each of nearby common-source conductive bus lines (BL0, BL2, BL4); and a plurality of word lines (WL0~WL3) are formed transversely to the plurality of common-source/drain conductive bus lines (BL's) with each of the plurality of word lines being connected with the control-gates of a plurality of paired multi-bit flash memory cells in each row.

From FIG. 2B and FIG. 2C, it is clearly visualized that each of the self-aligned multi-bit flash memory cells in a contactless flash memory array can easily store multi-threshold levels in each of dual floating-gates (FG1, FG2) by mid-channel hot-electron injection through a high lateral electric field across the semiconductor-substrate surface under the spacing dielectric layer 312a.

According to the description as addressed, a self-aligned multi-bit flash memory cell and its contactless flash memory array of the present invention exhibit the following advantages and features:

(a) The self-aligned multi-bit flash memory cell of the present invention is scalable and its cell size can be made to be smaller than $4F^2$.

(b) The self-aligned multi-bit flash memory cell of the present invention has two-separated floating-gates for storing multi-level digital data in each floating gate.

(c) The self-aligned multi-bit flash memory cell of the present invention can be programmed by mid-channel hot-electron injection with a higher programming efficiency and a less programming power as compared to the existing channel hot-electron injection.

(d) The contactless multi-bit flash memory array of the present invention offers the common-source/drain conductive bus lines as the bit lines with smaller bus-line resistances and smaller bus-line parasitic capacitance with respect to the semiconductor substrate as compared to the buried diffusion bit lines.

(e) The contactless multi-bit flash memory array of the present invention offers a highly conductive metal line as a word line with much smaller word-line resistance and much smaller word-line parasitic capacitance with respect to the bit lines.

Figure 3A:
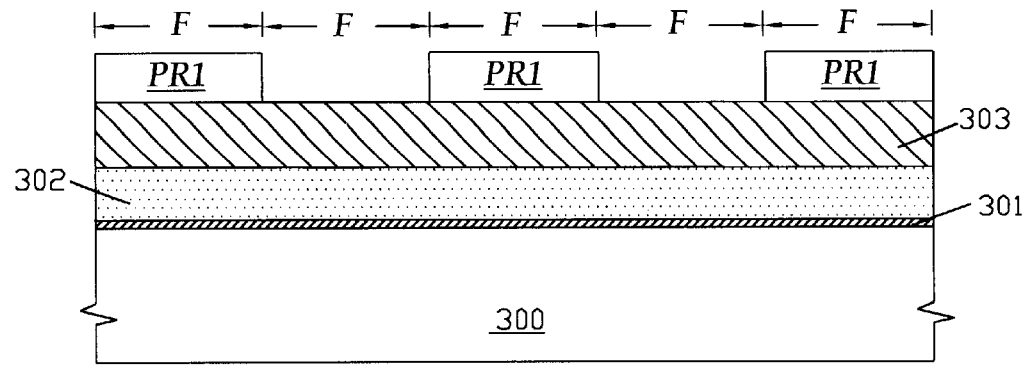
FIG. 3A through FIG. 3F show the process steps and their cross-sectional views of forming a shallow-trench-isolation structure for a self-aligned multi-bit flash memory cell and its contactless multi-bit flash memory array of the present invention.

Referring now to FIG. 3A through FIG. 3F, there are shown the process steps and their cross-sectional views of fabricating a shallow-trench-isolation (STI) structure for a self-aligned multi-bit flash memory cell and its contactless flash memory array. As shown in FIG. 3A, a first gate-dielectric layer 301 is formed over a semiconductor substrate 300 of a first conductivity type; a first conductivity layer 302 is formed over the first gate-dielectric layer 301; a first masking dielectric layer 303 is formed over the first conductivity layer 302; and a plurality of masking photoresist PR1 are formed over the first masking dielectric layer 303 to define a plurality of active regions (AA's) (under PR1) and a plurality of parallel shallow-trench-isolation regions (STI lines) (between PR1). The first gate-dielectric layer 301 is preferably a thermal-oxide layer or a nitrided thermal-oxide layer as a thin tunneling-dielectric layer and its thickness is preferably between 80 Angstroms and 120 Angstroms. The first gate-dielectric layer 301 can be an oxide-nitride-oxide (ONO) structure or a nitride-oxide structure as a storage element and its equivalent-oxide thickness is preferably between 50 Angstroms and 100 Angstroms. The first conductive layer 302 is preferably made of doped polycrystalline-silicon or doped amorphous-silicon as deposited by low-pressure chemical-vapor-deposition (LPCVD) and its thickness is preferably between 500 Angstroms and 2500 Angstroms. The first masking dielectric layer 303 is preferably made of silicon-nitrides as deposited by LPCVD.

Figure 3B:
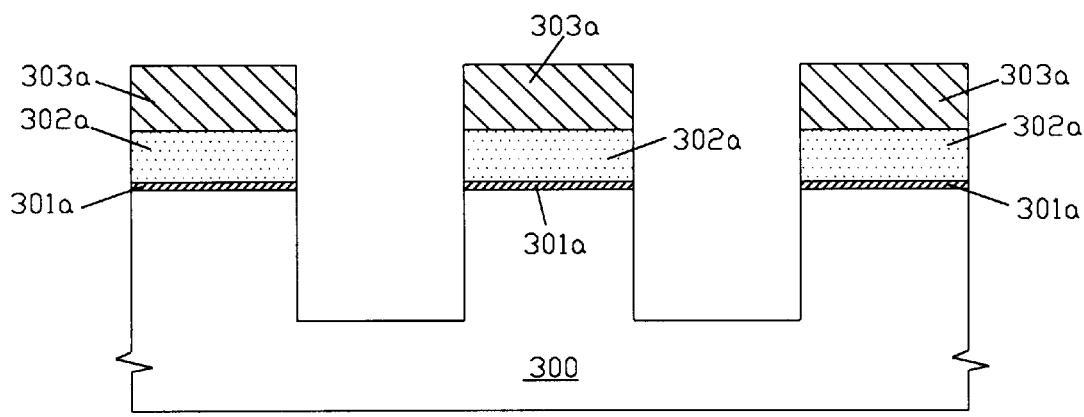

FIG. 3B shows that the first masking dielectric layer 303, the first conductive layer 302, and the first gate-dielectric layer 301 outside of the plurality of masking photoresist PR1 are sequentially removed and the semiconductor substrate 300 is then anisotropically etched to form shallow trenches; subsequently, the plurality of masking photoresist PR1 are stripped. The depth of shallow trenches in the semiconductor substrate 300 is preferably between 3000 Angstroms and 8000 Angstroms.

Figure 3C:
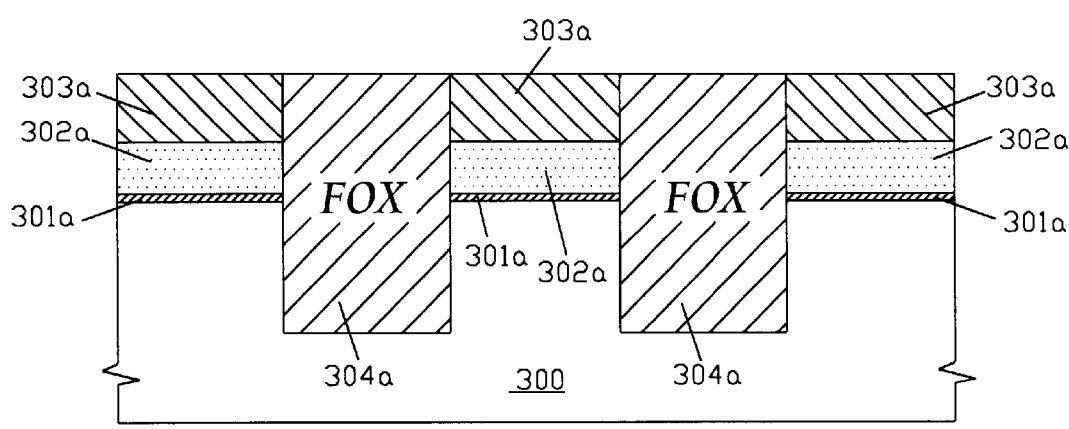

FIG. 3C shows that a planarized field-oxide layer 304a is formed over each of the shallow trenches by first depositing a thick-oxide layer 304 over the whole structure and then planarizing the deposited thick-oxide layer 304 using chemical-mechanical polishing (CMP) with the first masking dielectric layer 303a as a polishing stop. The thick-oxide layer 304 is preferably deposited by high-density plasma (HDP) CVD or CVD and is preferably made of silicon-oxides or phosphosilicate glass (PSG).

Figure 3D:
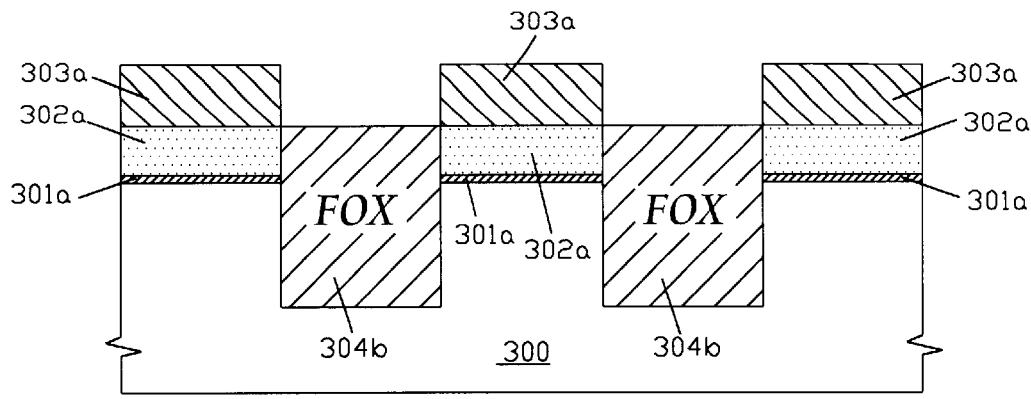

FIG. 3D shows that the planarized field-oxide layers 304a are anisotropically etched back to a depth approximately equal to a thickness of the first masking dielectric layer 303a to form the raised field-oxide layers 304b.

Figure 3E:
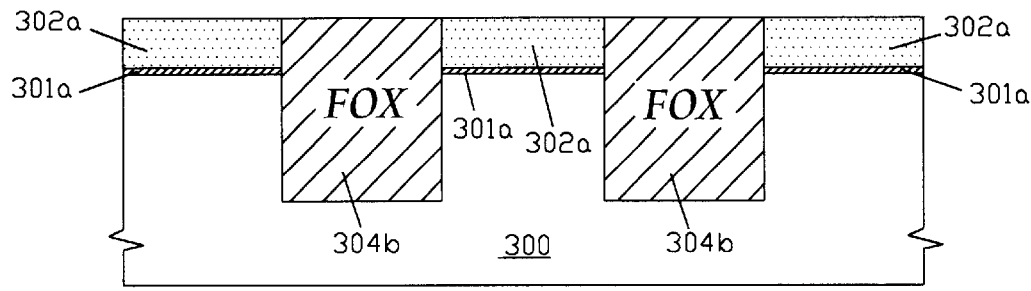

FIG. 3E shows that the first masking dielectric layers 303a are removed by using hot-phosphoric acid or anisotropic dry etching. It is clearly seen from FIG. 3E that a flat surface is formed alternately by the first conductive layer 302a and the raised field-oxide layer 304b.

Figure 3F:
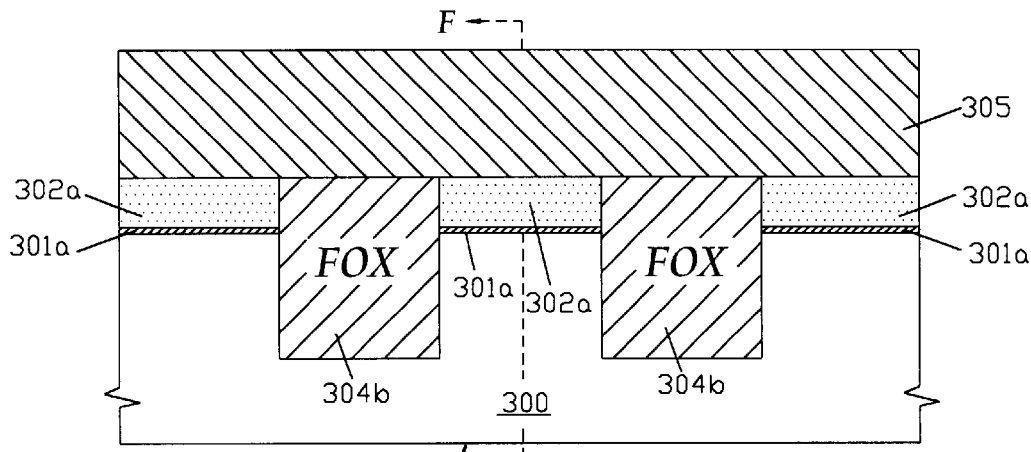

FIG. 3F shows that a second masking dielectric layer 305 is formed over the flat surface. The second masking dielectric layer 305 is preferably made of silicon-nitrides as deposited by LPCVD and its thickness is preferably between 3000 Angstroms and 15000 Angstroms. The cross-sectional view of an active region as indicated by the F—F' line is shown in FIG. 4A.

Figure 4A:
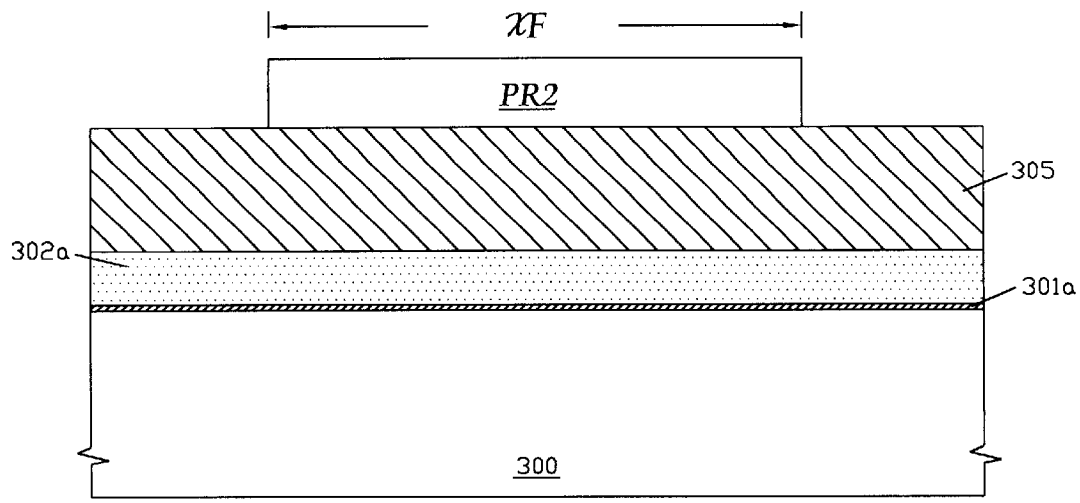
FIG. 4A through FIG. 4N show the process steps and their cross-sectional 30 views of forming a self-aligned multi-bit flash memory cell and its contactless multi-bit flash memory array of the present invention.
Figure 4B:
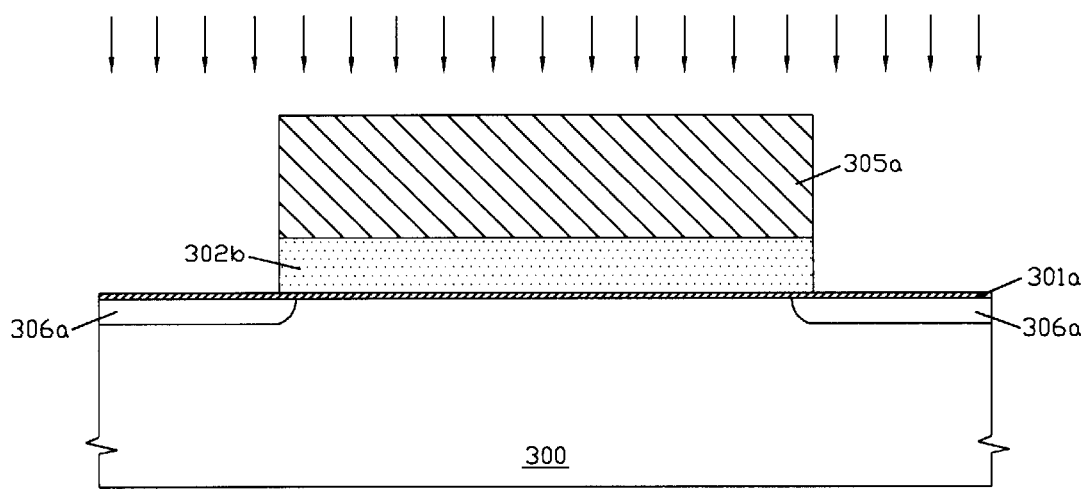
Figure 4C:
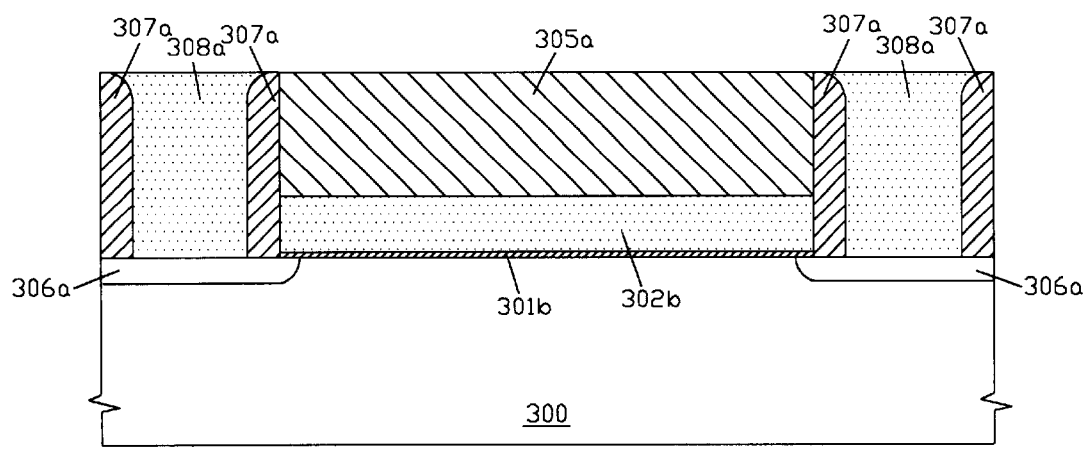
Figure 4D:
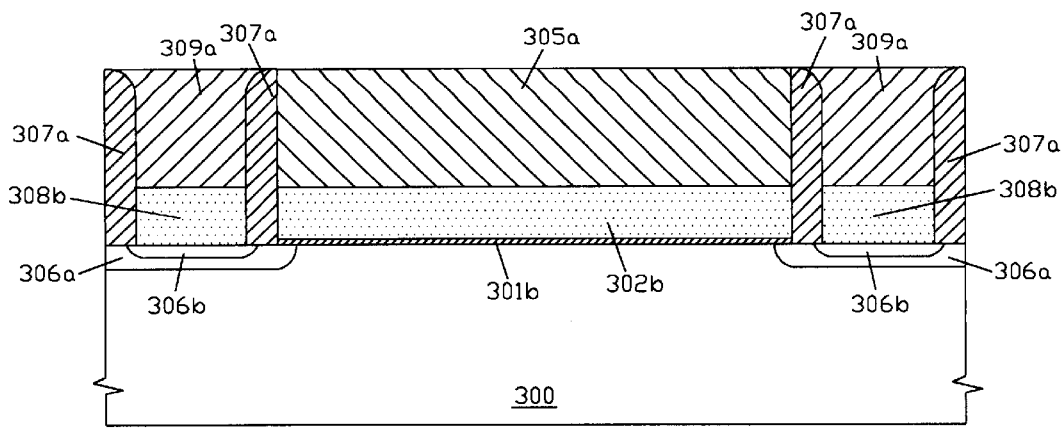
Figure 4E:
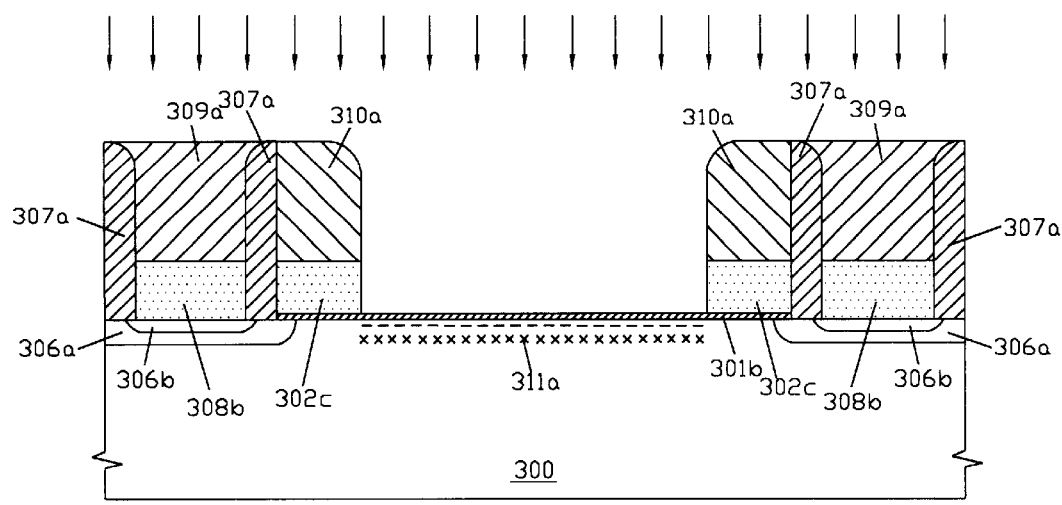
Figure 4F:
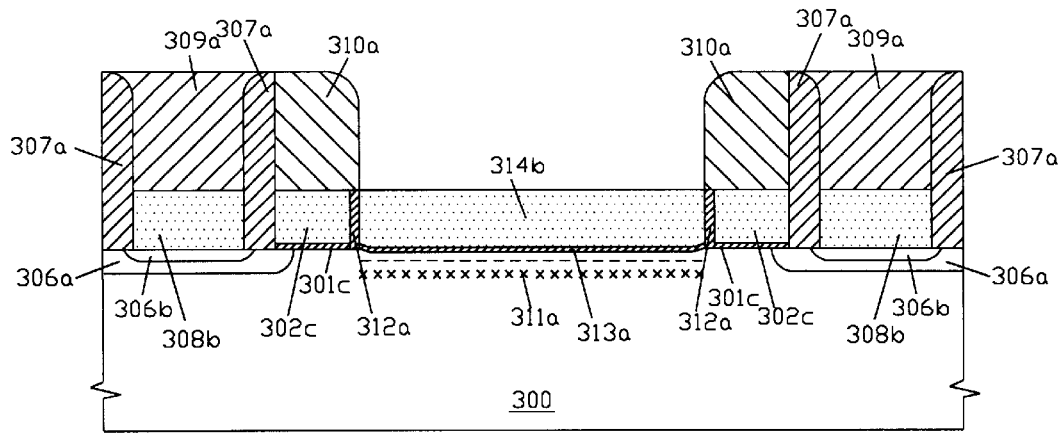
Figure 4G:
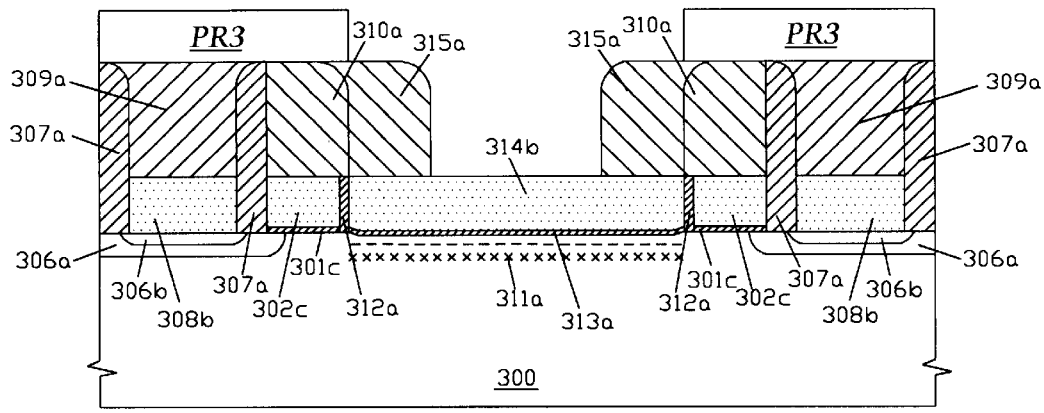
Figure 4H:
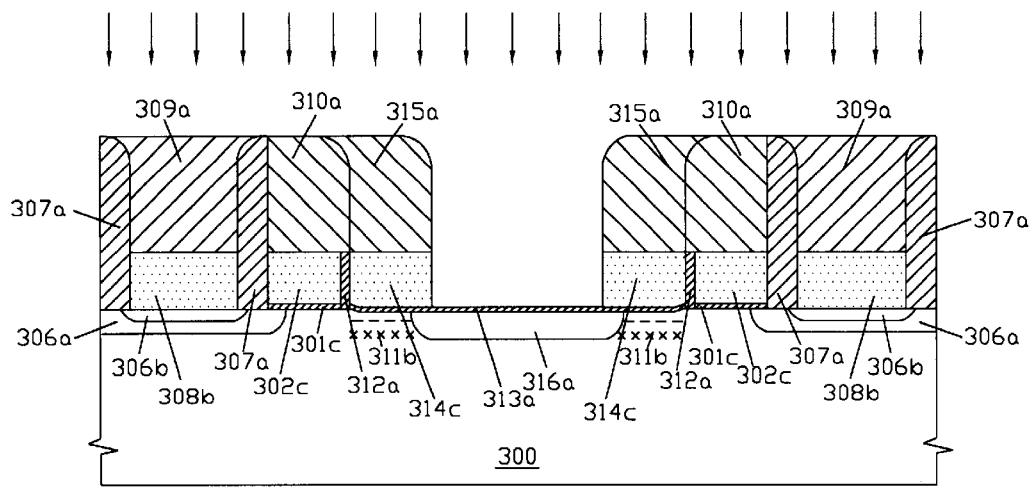
Figure 4I:
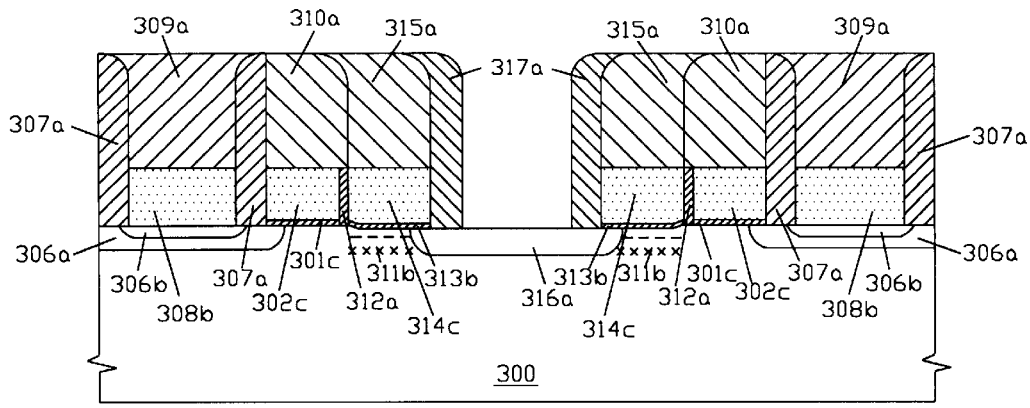
Figure 4J:
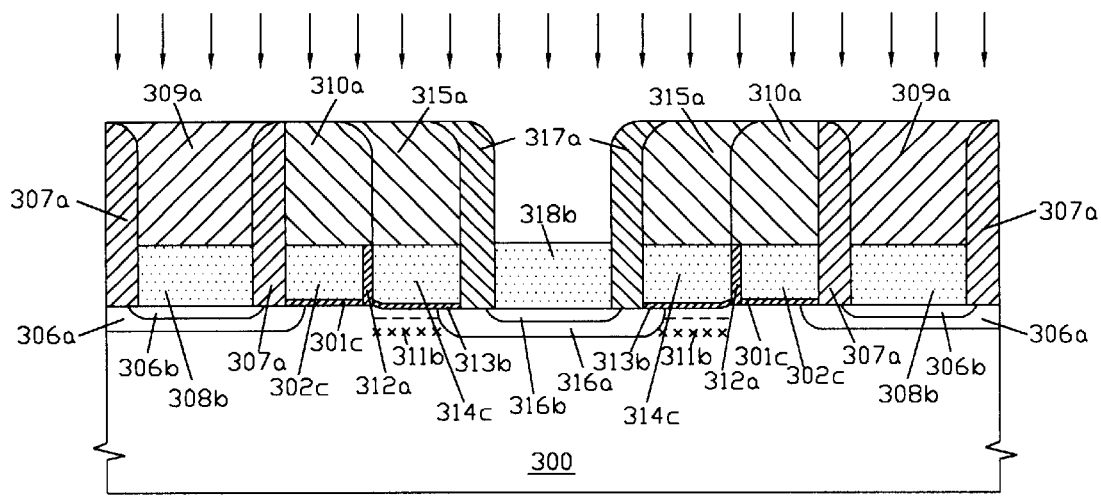
Figure 4K:
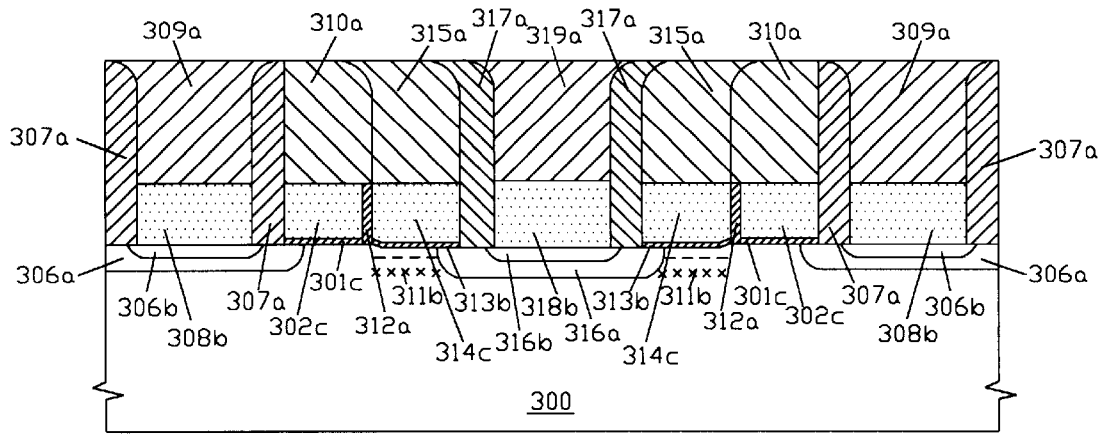
Figure 4L:
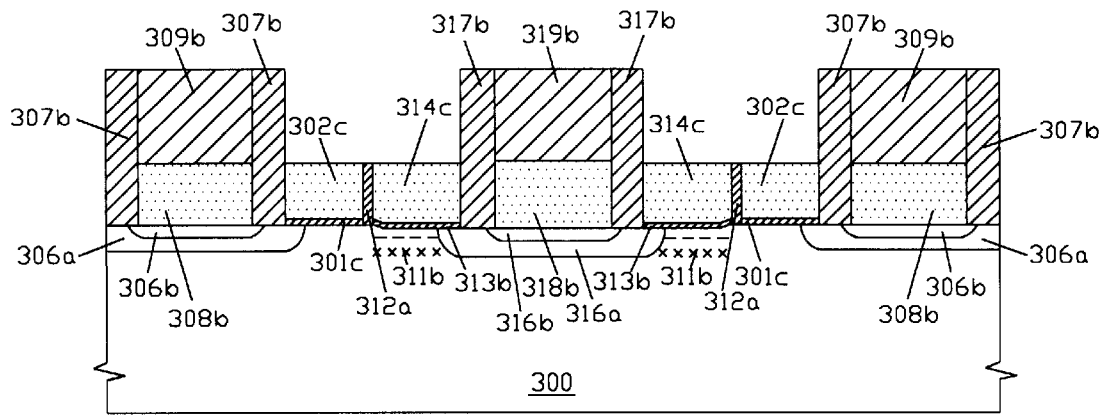
Figure 4M:
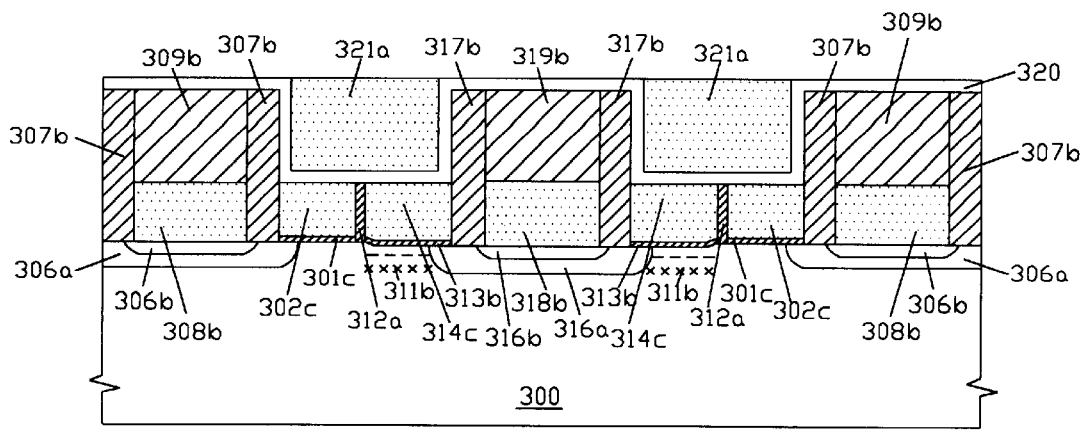
Figure 4M:
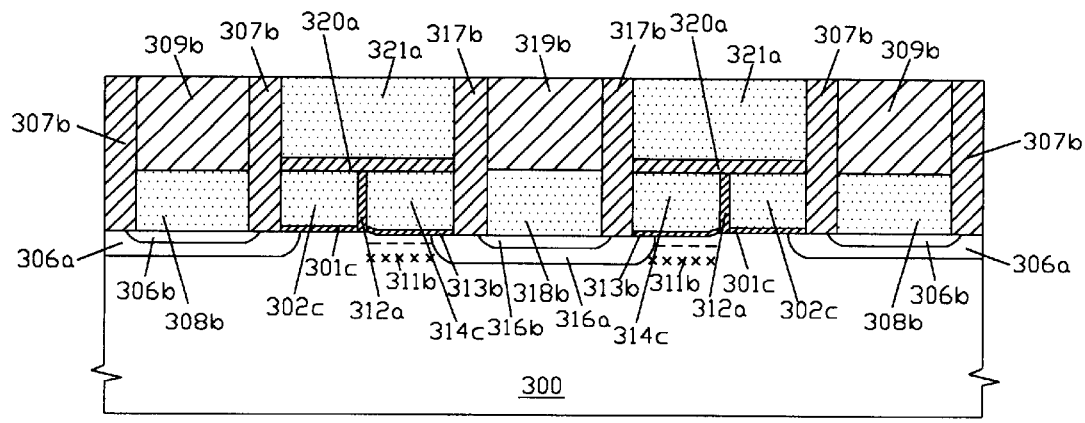
Figure 4N:
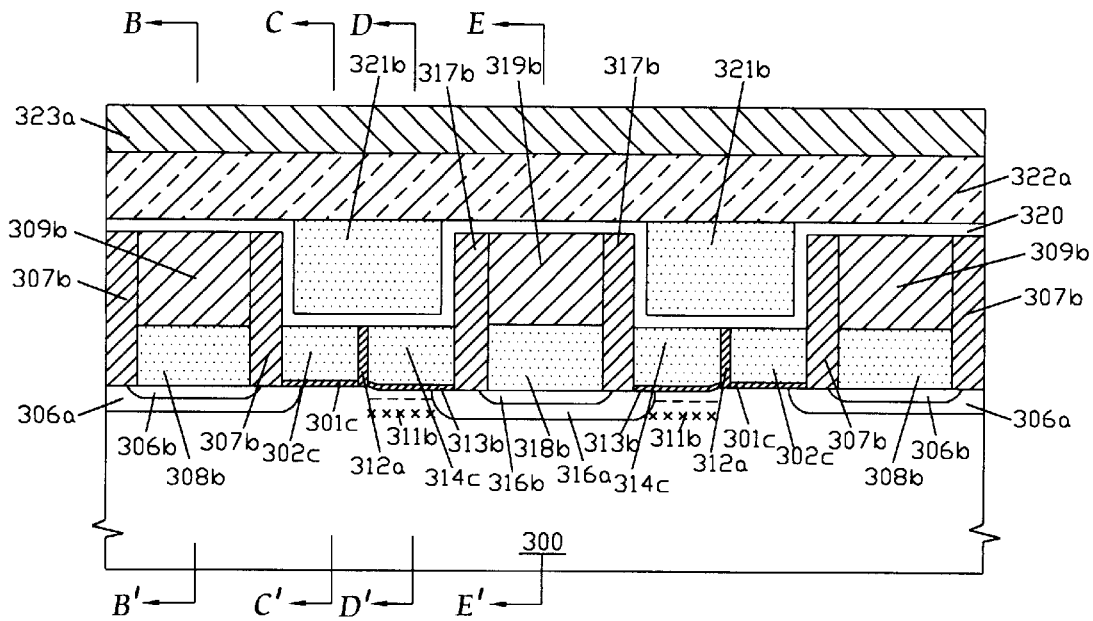
Figure 4N:
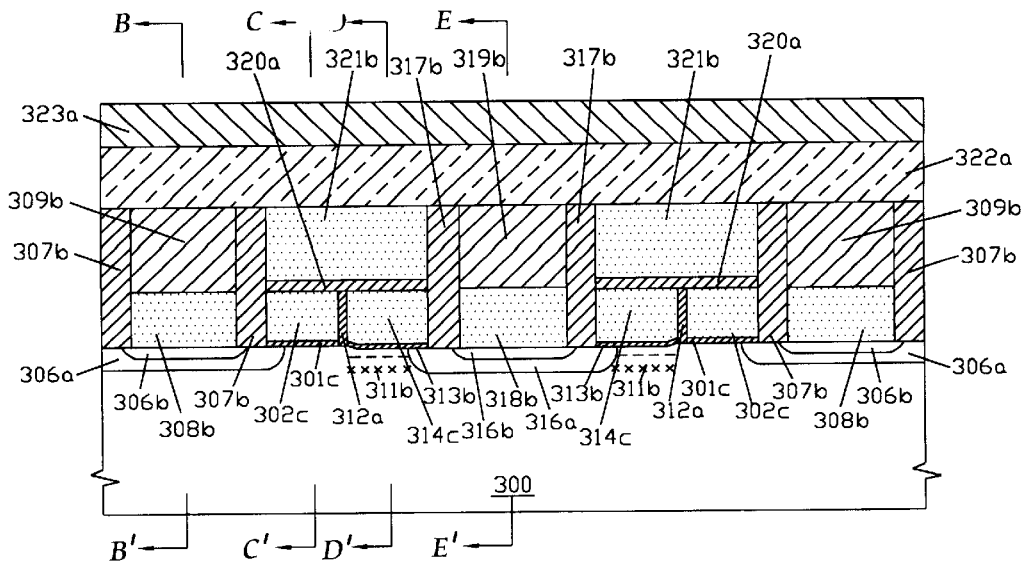

Referring now to FIG. 4A through FIG. 4N, there are shown the process steps and their cross-sectional views of fabricating a self-aligned multi-bit flash memory cell and its contactless flash memory array of the present invention. FIG. 4A shows only a small portion of an array, in which a masking photoresist PR2 is formed to define a virtual-gate region (under PR2). The virtual-gate region includes a pair of gate regions and a common-drain bus-line region, as marked by XF; the regions outside of PR2 are the common-source bus-line regions, as marked by F. Actually, a plurality of masking photoresist PR2 are formed transversely to the plurality of parallel STI regions with their spaces being used to define the common-source bus-line regions.

FIG. 4B shows that the second masking dielectric layer 305 outside of the plurality of masking phototesist PR2 is anisotropically removed first, then the raised field-oxide layers 304b are etched back to a depth equal to a thickness of the first conductive layer 302a, the first conductive layer 302a is subsequently removed, and then the plurality of masking photoresist PR2 are removed. An ion-implantation is then performed in a self-aligned manner by implanting doping impurities across the first gate-dielectric layers 301a into the plurality of active regions along each of the common-source bus-line regions to form a plurality of common-source diffusion regions 306a of a second conductivity type; and subsequently, the first gate-dielectric layers 301a and the raised field-oxide layers 304b in each of the plurality of common-source bus-line regions are etched to form a first flat bed being formed alternately by a common-source diffusion region 306a and an etched first raised field-oxide layer 304c. The common-source diffusion region 306a is preferably formed to be lightly doped, moderately doped or heavily-doped.

FIG. 4C shows that a pair of first sidewall dielectric spacers 307a are formed over the outer sidewalls of nearby virtual-gate regions and on a portion of the first flat bed; a planarized second conductive layer 308a is formed over each of the first flat bed between the pair of first sidewall dielectric spacers 307a. The planarized second conductive layer 308a is preferably made of doped polycrystalline-silicon as deposited by LPCVD and is formed by first depositing a thick second conductive layer 308 to fill up the gaps between the pair of first sidewall dielectric spacers 307a and then planarizing the deposited thick second conductive layer 308 with the second masking dielectric layer 305a as a polishing stop.

FIG. 4D shows that the planarized second conducive layers 308a are etched back to a depth approximately equal to a thickness of the second masking dielectric layer 305a and then the etched-back planarized second conductive layers 308b are heavily implanted with a high dose of doping impurities to act as the dopant diffusion sources for forming a heavily-doped diffusion region 306b of a second conductivity type within each of common-source diffusion regions 306a. It should be noted that a metal-silicide layer (not shown) can be formed over the etched-back planarized second conductive layer 308b to increase the conductivity of the common-source conductive bus lines 308b by using a well-known self-aligned silicidation technique or by a deposition technique similar to that of forming the etched-back planarized second conductive layer 308b. As shown in FIG. 4D, a first planarized thick-oxide layer 309a is formed over the common-source conductive bus line 308b and the pair of first sidewall dielectric spacers 307a in each of the common-source bus-line regions. The first planarized thick-oxide layers 309a are preferably made of silicon-oxides or phosphosilicate glass (PSG) as deposited by HDPCVD or CVD and are formed by first depositing a thick-oxide film 309 to fill up the gaps and then planarizing the deposited thick-oxide film 309 with the second masking dielectric layer 305a as a polishing stop.

FIG. 4E shows that the second masking dielectric layers 305a are selectively removed by using hot-phosphoric acid or anisotropic dry etching; a pair of third sidewall dielectric spacers 310a are then formed over each sidewall of the first sidewall dielectric spacers 307a in the common-source bus-line regions and a flat surface being alternately formed by the second conductive layer 302b and the raised fieldoxide layer 304b in each of the virtual-gate regions; the first conductive layer 302b between the pair of third sidewall dielectric spacers 310a in each of the virtual-gate regions is subsequently removed to form a pair of first floating-gate layers 302c; and then an ion-implantation is performed across the first gate-dielectric layers 301b in a self-aligned manner to form the implanted regions 311a of a first conductivity type in the semiconductor substrate 300 between the pair of third sidewall dielectric spacers 310a. As shown in FIG. 4E, the implanted region 311a may include a shallow implant region (the dash lines) for threshold-voltage adjustment and a deep implant region (the cross symbols) for forming a punch-through stop.

FIG. 4F shows that the first gate-dielectric layer 301b between the pair of third sidewall dielectric spacers 310a in each of the virtual-gate regions is removed by dipping in a dilute hydrofluoric acid or using an anisotropic dry etching; a thermal oxidation process is then performed to form a second gate-dielectric layer 313a over the semiconductor surface between the pair of third sidewall dielectric spacers 310a and a spacing dielectric layer 312a is formed over each outer sidewall of the pair of first floating-gate layers 302c; and a third conductive layer 314b is subsequently formed over the second gate-dielectric layer 313a and between the spacing dielectric layers 312a in each of the virtual-gate regions. The third conductive layer 314b is preferably made of doped polycrystalline or amorphous-silicon as deposited by LPCVD and is formed by first depositing a thick doped polycrystalline or amorphous-silicon film 314 to fill up the gaps between the pair of third sidewall dielectric spacers 310a and planarizing the deposited thick doped polycrystalline or amorphous-silicon film 314 using CMP with the pair of third sidewall dielectric spacers 310a as a polishing stop; and subsequently, the etching-back is performed to etch the planarized doped polycrystalline or amorphous-silicon layer 314a to a level approximately equal to the top surface of the pair of first floating-gate layers 302c.

FIG. 4G shows that a pair of fourth sidewall dielectric spacers 315a are formed over each sidewall of the pair of third sidewall dielectric spacers 310a and on a flat surface being formed alternately by the third conductive layer 314b and the raised field-oxide layer 304b in each of the virtual-gate regions; the non-critical masking photoresist PR3 are then formed over the common-source bus-line regions and the third sidewall dielectric spacers 310a; and subsequently, the raised field-oxide layers 304b between the pair of fourth sidewall dielectric spacers 315a are etched back approximately to a thickness of the third conductive layer 314b and then the third conductive layers 314b between the pair of fourth sidewall dielectric spacers, 315a are removed, as shown in FIG. 4H.

FIG. 4H shows that an ion-implantation is performed in a self-aligned 10 manner by implanting doping impurities across the second gate-dielectric layers 313a into the semiconductor substrate in the active regions between the pair of fourth sidewall dielectric spacers 315a in each of the virtual-gate regions to form the common-drain diffusion regions 316a of a second conductivity type. The common-drain diffusion region 316a can be lightly doped, moderately doped, or heavily doped.

FIG. 4I shows that the second gate-dielectric layers 313a between the pair of fourth sidewall dielectric spacers 315a are removed by dipping in a dilute hydrofluoric acid or using an anisotropic dry etching. The etched-back raised field-oxide layers 304b are simultaneously etched to form a second flat bed being formed alternately by a common-drain diffusion region 316a and an etched second raised field-oxide layer 304e; and a pair of second sidewall dielectric spacers 317a are formed over each sidewall of the pair of fourth sidewall dielectric spacers 315a and a pair of second floating-gate layers 314c and on a portion of the second flat bed in each of the virtual gate regions. The second sidewall dielectric spacer 317a is preferably made of silicon-oxides as deposited by LPCVD.

FIG. 4J shows that a fourth conductive layer 318b is formed over a second flat bed between the pair of second sidewall dielectric spacers 317a in each of the virtual-gate regions and an ion-implantation is performed in a self-aligned manner by implanting a high dose of doping impurities into the fourth conductive layer 318b to be acted as a dopant diffusion source for forming a heavily-doped drain diffusion region 316b of a second conductivity type within a common-drain diffusion region 316a. The fourth conductive layer 318b is preferably made of doped polycrystalline-silicon as deposited by LPCVD and is preferably capped with a metal-silicide layer to form a common-drain conductive bus line 318b.

FIG. 4K shows that a second planarized thick-oxide layer 319a is formed over the common-drain conductive bus line 318b and the pair of second sidewall dielectric spacers 317a in each of the virtual-gate regions, which is similar to that of the first planarized thick-oxide layer 309a.

FIG. 4L shows that the first/second planarized thick-oxide layers 309a, 319a and the first/second sidewall dielectric spacers 307a, 317a are etched back to remove the curve portions of the first/second sidewall dielectric spacers 307a, 317a; and subsequently, the third/fourth sidewall dielectric spacers 310a, 315a are selectively removed by hot-phosphoric acid or anisotropic dry etching.

FIG. 4M(a) shows that an intergate-dielectric layer 320 is formed over the formed structure as shown in FIG. 4L and the planarized control-gate layers 321a are formed over the gaps between the intergate-dielectric layer 320. The intergate dielectric layer 320 is preferably an oxide-nitride-oxide structure or a nitride-oxide structure having an equivalent-oxide thickness between 80 Angstroms and 120 Angstroms and can be a silicon-oxide layer deposited by high-temperature oxide (HTO) deposition having a thickness between 100 Angstroms and 500 Angstroms. The planarized control-gate layer 321a is preferably made of doped polycrystalline-silicon or can be a planarized tungsten-silicide layer being formed within a planarized thin doped polycrystalline-silicon layer. FIG. 4M(b) shows that a thin thermalpolyoxide layer or a thin nitrided thermal-polyoxide layer 320a is thermally formed over the first/second floating-gate layers 302c, 314c having a thickness between 100 Angstroms and 250 Angstroms; and a planarized control-gate layer 321a is formed over the thin thermal-polyoxide layer or the thin nitrided thermal-polyoxide layer and the raised field-oxide layers 304b, 304d between the first/second sidewall dielectric spacers 307b, 317b. It should be noted that the planarized control-gate layer 321a can be heavily implanted with a high dose of doping impurities to increase the conductivity of the planarized control-gate layer 321a and can be capped with a self-aligned metal-silicide layer such as titanium-silicides ($TiSi_2$) or cobalt-silicides ($CoSi_2$).

FIG. 4N(a) and FIG. 4N(b) show that a first interconnect-metal layer 322 over a barrier-metal layer is formed over the planarized structure shown in FIG. 4M(a) and FIG. 4M(b) and a set of hard masking layers are formed over the first interconnect-metal layer 322 to simultaneously pattern and etch the first interconnect-metal layer 322 and the planarized control-gate layers 321a for forming a plurality of word lines 322a integrated with the planarized control-gate layers 321b. Each of the hard masking layers includes a masking dielectric layer 323a being aligned above each of the plurality of active regions and two sidewall dielectric spacers 324a being formed over the sidewalls of the masking dielectric layer 323a. The first interconnect-metal layer 322a is preferably made of aluminum or copper and the barrier-metal layer is preferably a titanium-nitride (TiN) or tantalum-nitride (TaN) layer. The masking dielectric layer 323a and its two sidewall dielectric spacers 324a are preferably made of silicon-nitrides or silicon-oxides as deposited by LPCVD. The cross-sectional views along each line shown in FIG. 4N(a) are separately shown in FIG. 5A through FIG. 5D and the cross-sectional views along each line shown in FIG. 4N(b) are separately shown in FIG. 6A through FIG. 6D.

Figure 5A:
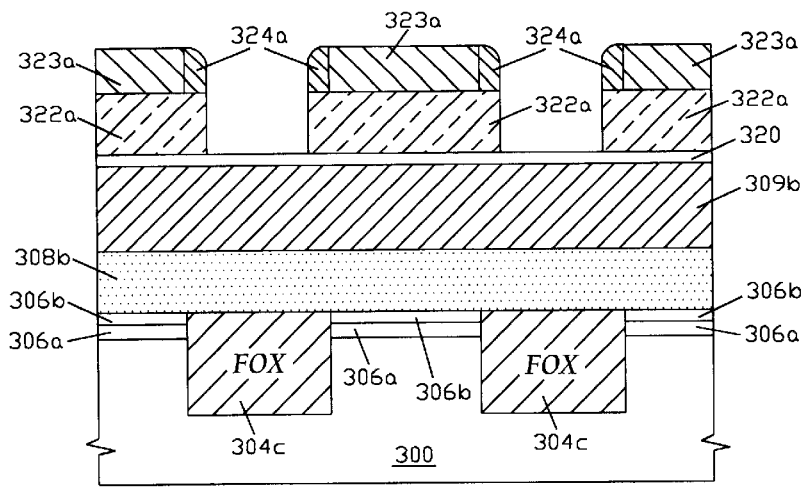
FIG. 5A through FIG. 5D show different cross-sectional views of a self-aligned multi-bit flash memory cell and its contactless multi-bit flash memory array for the first embodiment of the present invention.

Referring now to FIG. 5A through FIG. 5D, there are shown different cross-sectional views of a self-aligned multi-bit flash memory cell and its contactless flash memory array for the first embodiment of the present invention shown in FIG. 4N(a). FIG. 5A shows a cross-sectional view along a common-source conductive bus line 308b as indicated by the B—B' line shown in FIG. 4N(a), in which a common-source conductive bus line 308b is formed over a first flat bed being alternately formed by an etched first raised field-oxide layer 304c and a shallow heavily-doped source diffusion region 306b of a second conductivity type formed within a common-source diffusion region 306a; a first planarized thick-oxide layer 309b is formed over the common-source conductive bus line 308b; an intergate-dielectric layer 320 is formed over the first planarized thick-oxide layer 309b; a plurality of first interconnect-metal layers 322a being patterned by a set of hard masking layers are formed over the intergate-dielectric layer 320. Each of the hard masking layers includes a masking dielectric layer 323a being aligned above the active region and two sidewall dielectric spacers 324a being formed over the sidewalls of the masking dielectric layer 323a.

Figure 5B:
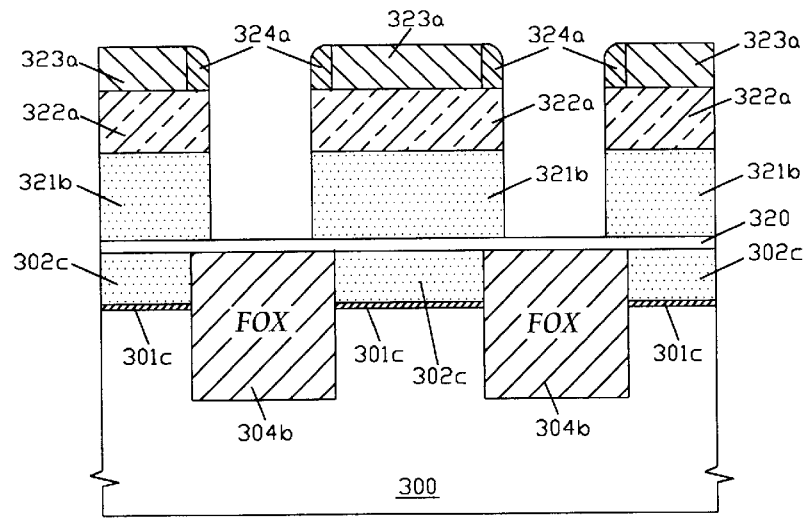

FIG. 5B shows a cross-sectional view along the first floating-gates as indicated by the C—C' line shown in FIG. 4N(a), in which a plurality of first interconnect-metal layers 322a integrated with the control-gate layers 321b are simultaneously patterned and etched by a set of hard masking layers and are formed over the intergate-dielectric layer 320; the intergate-dielectric layer 320 is formed over a flat surface being alternately formed by the raised field-oxide layer 304b and the floating-gate layer 302c. Each of the hard masking layers includes a masking dielectric layer 323a being aligned above the active region having the first floating-gate layer 302c formed over a first gate-dielectric layer 301c. It is clearly seen that the masking dielectric layer 323a is aligned above the first floating-gate layer 302c in the active region and the two sidewall dielectric spacers 324a are used to eliminate the misalignment between the control-gate 321b with respect to the first floating-gate layer 302c.

Figure 5C:
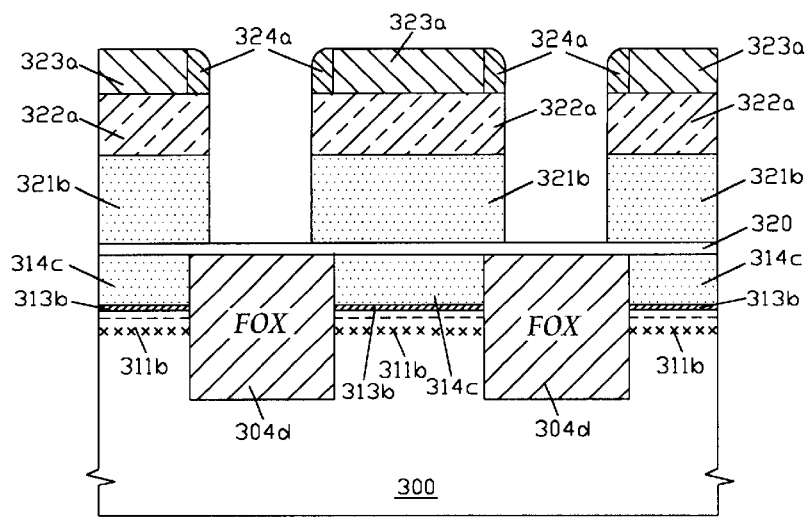

FIG. 5C shows a cross-sectional view along the second floating-gates as indicated by the D–D' line shown in FIG. 4N(a), in which an intergate-dielectric layer 320 is formed over a flat surface being alternately formed by the raised field-oxide layer 304d and the second floating-gate layer 314c; the second floating-gate layer 314c is formed over a second gate-dielectric layer 313b; an implanted region 311b including a shallow implant region for threshold-voltage adjustment and a deep implant region for forming a punch-through stop is formed in the semiconductor substrate 300 of the active region; a plurality of first interconnect-metal layers 322a integrated with the control-gate layers 321b are simultaneously patterned and etched by a set of hard masking layers as described. Similarly, the masking dielectric layer 323a and its two sidewall dielectric spacers 324a are used to eliminate the misalignment between the control-gate layer 321a with respect to the second floating-gate layer 314c.

Figure 5D:
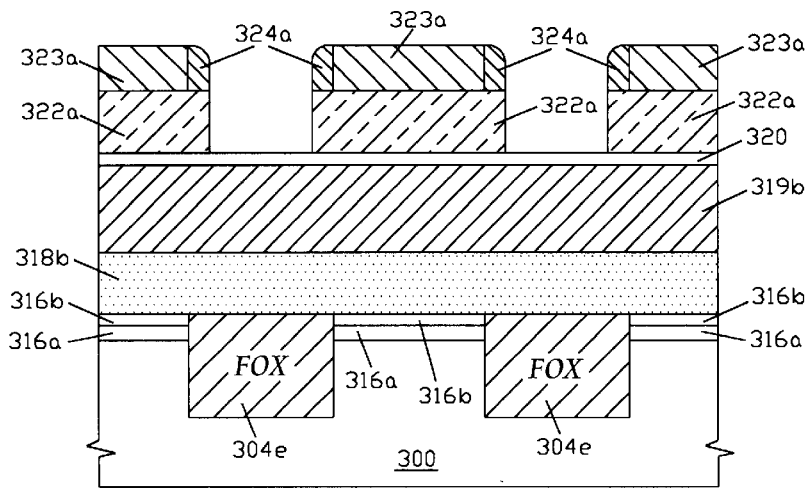
Figure 6A:
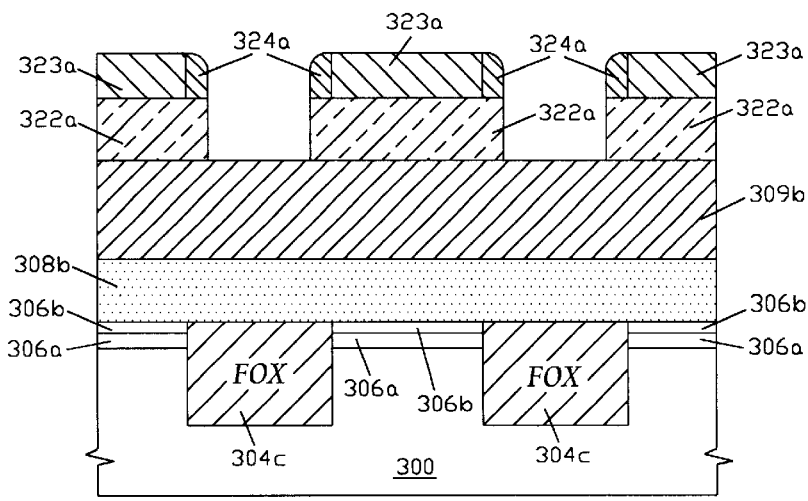
FIG. 6A through FIG. 6D show different cross-sectional views of a self-aligned multi-bit flash memory cell and its contactless multi-bit flash memory array for the second embodiment of the present invention.
Figure 6B:
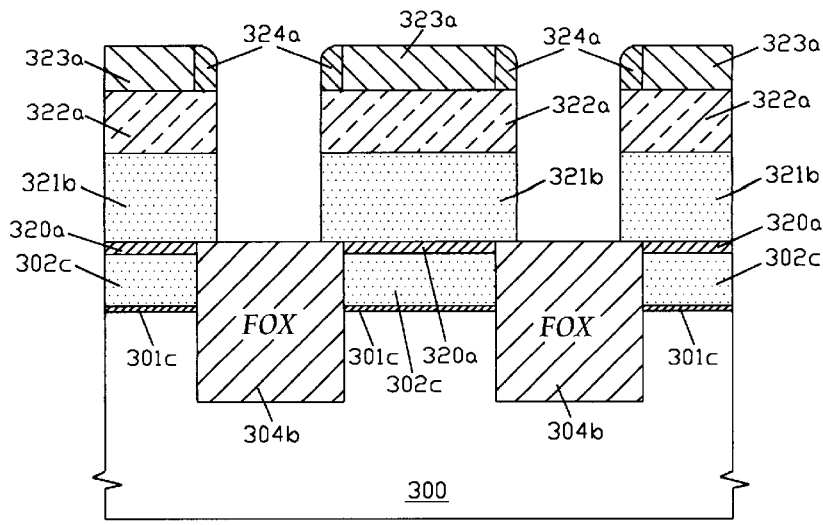
Figure 6C:
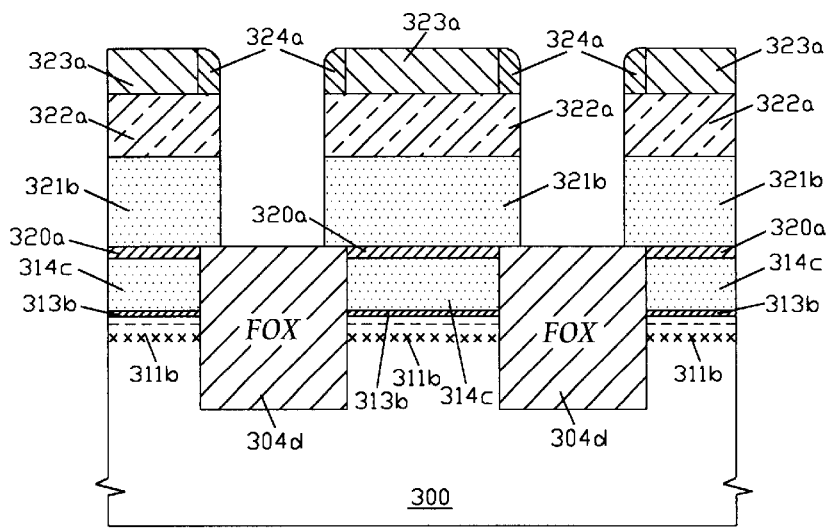
Figure 6D:
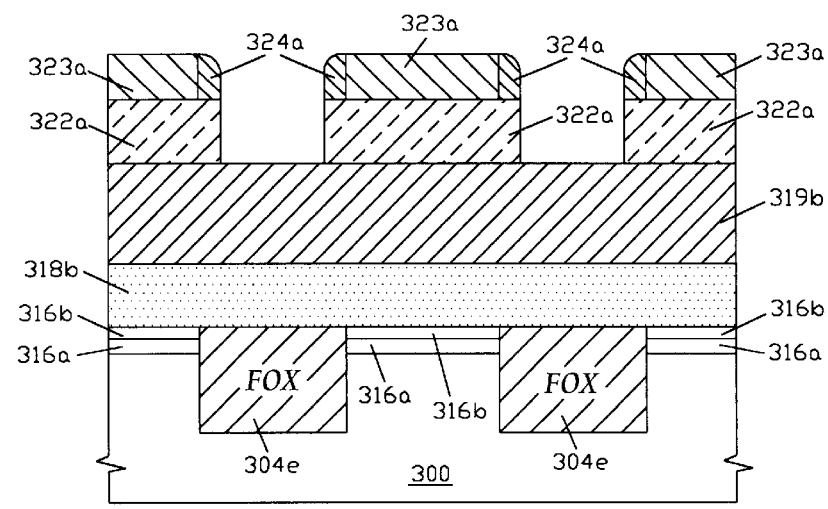

FIG. 5D shows a cross-sectional view along a common-drain conductive bus line 318b as indicated by the E–E' line shown in FIG. 4N(a), in which a common-drain conductive bus line 318b is formed over a second flat bed being formed alternately by the second etched raised field-oxide layer 304e and a shallow heavily-doped drain diffusion region 316b of a second conductivity type being formed within a common-drain diffusion region 316a; a second planarized thick-oxide layer 319b is formed over the common-drain conductive bus line 318b; an intergate-dielectric layer 320 is formed over the second planarized thick-oxide layer 319b; and a plurality of first interconnect-metal layers 322a are patterned and etched by a set of hard making layers as described.

Referring now to FIG. 6A through FIG. 6D, there are shown different cross-sectional views for the second embodiment of the present invention as shown in FIG. 4N(b). Compared FIG. 6A to FIG. 5A and compared FIG. 6D to FIG. 5D it is clearly seen that the intergate-dielectric layer 320 in FIG. 5A and FIG. 5D does not exist for FIG. 6A and FIG. 6D. Similarly, compared FIG. 6B to FIG. 5B and compared FIG. 6C to FIG. 5C, it is clearly seen that the intergate-dielectric layer 320 in FIG. 5B and FIG. 5C is replaced by an intergate-dielectric layer 320a being only formed over each of the first/second floating-gate layers for FIG. 6B and FIG. 6C. Therefore, the detailed description for FIG. 6A through FIG. 6D are neglected.

From FIG. 5A through FIG. 5D and FIG. 6A through FIG. 6D, it is clearly visualized that the common-source/drain conductive bus line being acted as the bit line offers a smaller bus-line resistance, a smaller bus-line parasitic capacitance with respect to the semiconductor substrate 300, and a smaller parasitic capacitance between the word lines and the bit lines, as compared to the buried diffusion layer of the prior art; the first interconnect-metal layer being acted as the word line offers a smaller wordline resistance as compared to the polycide-gate line of the prior art.

While the present invention has been particularly shown and described with a reference to the present examples and embodiments as considered as illustrative and not restrictive. Moreover, the present invention is not to be limited to the details given herein, it will be understood by those skilled in the art that various changes in form and details may be made without departure from the true spirit and scope of the present invention.

What is claimed is:

1. A self-aligned multi-bit flash memory cell, comprising:
    a semiconductor substrate of a first conductivity type having an active region isolated by two parallel shallow-trench-isolation (STI) regions, wherein each of said parallel STI regions is filled with a raised field-oxide layer;
    a cell region being formed on said semiconductor substrate and divided into three regions: a common-source region, a gate region, and a common-drain region, wherein said gate region is formed between said common-source region and said common-drain region;
    said common-source region comprises a first sidewall dielectric spacer being formed over a sidewall of said gate region and on a portion of a first flat bed being formed by a common-source diffusion region in said active region and two etched first raised field-oxide layers in said two parallel STI regions, a common-source conductive bus line being formed on said first flat bed outside of said first sidewall dielectric spacer, and a first planarized thick-oxide layer being formed over said common-source conductive bus line and said first sidewall dielectric spacer;

said common-drain region comprises a second sidewall dielectric spacer being formed over another sidewall of said gate region and on a portion of a second flat bed being formed by a common-drain diffusion region in said active region and two etched second raised field-oxide layers in said two parallel STI regions, a common-drain conductive bus line being formed on said second flat bed outside of said second sidewall dielectric spacer, and a second planarized thick-oxide layer being formed over said common-drain conductive bus line and said second sidewall dielectric spacer, said gate region comprises a first floating-gate structure having a first floating-gate layer formed on a first gate-dielectric layer and a second floating-gate structure having a second floating-gate layer formed on a second gate-dielectric layer in said active region, a spacing dielectric layer being formed between said first floating-gate structure and said second floating-gate structures and a planarized control-gate layer spaced by an intergate dielectric layer being at least formed on said first floating-gate structure, said spacing dielectric layer, and said second floating-gate structure; and a first interconnect-metal layer together with said planarized control-gate layer being simultaneously patterned and etched to form a word line transversely to said common-source/drain conductive bus lines.

2. The self-aligned multi-bit flash memory cell according to claim 1, wherein said first/second gate-dielectric layer is preferably a thermal-oxide or nitrided thermal-oxide layer having a thickness between 80 Angstroms and 120 Angstroms and is acted as a tunneling dielectric layer.

3. The self-aligned multi-bit flash memory cell according to claim 1, wherein said first/second gate-dielectric layer is preferably a oxide-nitrideoxide (ONO) or nitride-oxide structure having an equivalent-oxide thickness between 50 Angstroms and 100 Angstroms and is acted as a storage element.

4. The self-aligned multi-bit flash memory cell according to claim 1, wherein said intergate dielectric layer is preferably a oxide-nitride-oxide (ONO) or nitride-oxide structure having an equivalent-oxide thickness between 80 Angstroms and 120 Angstroms and is at least formed over said first/second planarized thick-oxide layers in said common-source/drain regions, said raised field-oxide layers in said parallel STI regions, and said first/second floating-gate layers and said spacing dielectric layer in said active region.

5. The self-aligned multi-bit flash memory cell according to claim 1, wherein said intergate dielectric layer is preferably a thermal poly-oxide or nitrided thermal poly-oxide layer having a thickness between 100 Angstroms and 300 Angstroms and is only formed over said first/second floating-gate layers and said spacing dielectric layer in said active region.

6. The self-aligned multi-bit flash memory cell according to claim 1, wherein said common-source/drain conductive bus line is preferably a heavily-doped polycrystalline-silicon layer being capped with a metal-silicide layer such as a tungsten-silicide layer or other refractory-metal silicide layer and said heavily-doped polycrystalline-silicon layer is acted as a dopant diffusion source for forming a shallow heavily-doped diffusion region of said second conductivity type within said common-source/drain diffusion region.

7. The self-aligned multi-bit flash memory cell according to claim 1, wherein said first interconnection-metal layer is preferably a copper or aluminum layer being formed over a barrier-metal layer such as a titanium-nitride (TiN) or tantalum-nitride (TaN) layer and is patterned by a hard masking layer with a third masking dielectric layer being aligned above said active region and two sidewall dielectric spacers being formed over each sidewall of said third masking dielectric layer.

8. The self-aligned multi-bit flash memory cell according to claim 1, wherein an implanted region of said first conductivity type is formed in said semiconductor substrate under said second floating-gate structure and comprises a shallow implant region for threshold-voltage adjustment and a deep implant region for forming a punch-through stop.

9. The self-aligned multi-bit flash memory cell according to claim 1, wherein said planarized control-gate layer is preferably a planarized heavily-doped polycrystalline-silicon layer being silicided with a metal-silicide layer such as a titanium-silicide (TiSi2) or cobalt-silicide (CoSi2) layer and can be a planarized tungsten-silicide layer being formed within a planarized heavily-doped polycrystalline-silicon layer.

10. A contactless multi-bit flash memory array, comprising:

a semiconductor substrate of a first conductivity type having a plurality of parallel shallow-trench-isolation (STI) regions and a plurality of active regions formed alternately over said semiconductor substrate, wherein each of the plurality of parallel STI regions is filled with a raised field-oxide layer;

a plurality of common-source bus-line regions and a plurality of virtual-gate regions being formed alternately and transversely to the plurality of parallel STI regions, wherein:

each of the plurality of virtual-gate regions comprises a pair of gate regions being located in each side portion with a common-drain bus-line region being located between the pair of gate regions;

each of the plurality of common-source bus-line regions comprises a pair of first sidewall dielectric spacers being formed over each sidewall of nearby virtual-gate regions and on a first flat bed being alternately formed by a common-source diffusion region in said active region and an etched first raised field-oxide layer in said parallel STI region, a common-source conductive bus line being formed over said first flat bed between the pair of first sidewall dielectric spacers, and a first planarized thick-oxide layer being formed over said common-source conductive bus line and the pair of first sidewall dielectric spacers;

each of said common-drain bus-line regions comprises a pair of second sidewall dielectric spacers being formed over each sidewall of the pair of gate regions and on a second flat bed being alternately formed by a common-drain diffusion region in said active region and an etched second raised field-oxide layer in said parallel STI region, a common-drain conductive bus line being formed over said second flat bed between the pair of second sidewall dielectric spacers, and a second planarized thick-oxide layer being formed over said common-drain conductive bus line and the pair of second sidewall dielectric spacers;

a plurality of self-aligned multi-bit flash memory cells being formed in each of the pair of gate regions for each of the plurality of virtual-gate regions, wherein each of the plurality of self-aligned multi-bit flash memory cells comprises a first floating-gate structure having a first floating-gate layer formed on a first gate-dielectric layer and a second floating-gate structure having a second floating-gate layer formed on a second gate-dielectric layer being formed in said active region, a spacing dielectric layer being formed between said first floating-gate structure and said second- floating-gate structure, and a planarized control-gate layer spaced by an intergate dielectric layer being at least formed on said first floating-gate structure, said spacing dielectric layer, and said second floating-gate structure; and a plurality of word lines being formed transversely to the plurality of common-source/drain conductive bus lines, wherein each of the plurality of word lines comprises a first interconnect-metal layer and a plurality of planarized control-gate layers in each row being patterned and etched by a hard masking layer having a third masking dielectric layer aligned above each of the plurality of active regions and two sidewall dielectric spacers being formed over each sidewall of said third masking dielectric layer.

11. The contactless multi-bit flash memory array according to claim 10, wherein said first/second gate-dielectric layer is preferably a thermal-oxide or nitrided thermal-oxide layer having a thickness between 80 Angstroms and 120 Angstroms and is acted as a tunneling dielectric layer.

12. The contactless multi-bit flash memory array according to claim 10, wherein said fist/second gate-dielectric layer is preferably a oxide-nitride-oxide (ONO) or nitride-oxide structure having an equivalent-oxide thickness between 50 Angstroms and 100 Angstroms and is acted as a storage clement.

13. The contactless multi-bit flash memory array according to claim 10, wherein said intergate dielectric layer is preferably a oxide-nitride-oxide (ONO) or nitride-oxide structure having an equivalent-oxide thickness between 80 Angstroms and 120 Angstroms and is at least formed over said first/second planarized thick-oxide layers in said common-source/drain conductive bus-line regions, said raised field-oxide layers in said parallel STI regions, said first/second floating-gate layers and said spacing dielectric layer in said active region.

14. The contactless multi-bit flash memory array according to claim 10, wherein said intergate dielectric layer is preferably a thermal poly-oxide or nitrided thermal poly-oxide layer having a thickness between 100 Angstroms and 300 Angstroms and is only formed over said first/second floating-gate layers and said spacing dielectric layer in said active region.

15. The contactless multi-bit flash memory array according to claim 10, wherein said common-source/drain conductive bus line is preferably a heavily-doped polycrystalline-silicon layer being capped with a metal-silicide layer such as a tungsten-silicide or other refractory-metal silicide layer and said heavily-doped polycrystalline-silicon layer is acted as a dopant diffusion source for forming a shallow heavily-doped diffusion region of said second conductivity type within said common-source/drain diffusion region.

16. The contactless multi-bit flash memory array according to claim 10, wherein said first interconnect-metal layer is preferably a copper or aluminum layer being formed over a barrier-metal layer such as a titanium-nitride (TiN) or tantalum-nitride (TaN) layer.

17. The contactless multi-bit flash memory array according to claim 10, wherein an implanted region of said first conductivity type is formed in said semiconductor substrate under said second floating-gate structure and comprises a shallow implant region for threshold-voltage adjustment and a deep implant region for forming a punch-through stop.

18. The contactless multi-bit flash memory array according to claim 10, wherein said planarized control-gate layer is preferably a planarized heavily-doped polycrystalline-silicon layer being silicided with a metal-silicide layer such as a titanium-silicide ($TiSi_2$) or cobalt-silicide ($CoSi_2$) layer and can be a planarized tungsten-silicide layer being formed within a planarized heavily-doped polycrystalline-silicon layer.

19. A contactless multi-bit flash memory array, comprising:

a plurality of common-source conductive bit lines being formed in parallel in a first direction;

a plurality of paired multi-bit flash memory cells being formed between the plurality of common-source conductive bit lines, wherein a plurality of common-source diffusion regions of the plurality of paired multi-bit flash memory cells are electrically connected to the plurality of common-source conductive bit lines;

a plurality of common-drain conductive bit lines being formed between the plurality of paired multi-bit flash memory cells, wherein a plurality of common-drain diffusion regions of the plurality of paired multi-bit flash memory cells are electrically connected to the plurality of common-drain conductive bit lines; and a plurality of word lines integrated with a plurality of control-gates of the plurality of paired multi-bit flash memory cells being simultaneously patterned and formed in a second direction being perpendicular to said first direction, wherein each gate region of the plurality of paired multi-bit flash memory cells comprises a first floating-gate structure having a first floating-gate layer formed on a first gate-dielectric layer and a second floating-gate structure having a second floating-gate layer formed on a second gate-dielectric layer; a spacing dielectric layer being formed between said first floating-gate structure and said second floating-gate structure; an intergate-dielectric layer being at least formed over said first floating-gate structure, said second floating-gate structure and said spacing dielectric layer; and a planarized conductive layer acted as said control-gate being at least formed on said intergate dielectric layer.

20. The contactless multi-bit flash memory array according to claim 19, wherein each of the plurality of word lines being made of a first interconnection-metal layer together with said control-gates in said another direction are simultaneously patterned and etched by a hard masking layer.

* * * * *